United States Patent
Matsumoto

(10) Patent No.: US 10,074,516 B2
(45) Date of Patent: Sep. 11, 2018

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventor: Hironobu Matsumoto, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 15/637,699

(22) Filed: Jun. 29, 2017

(65) Prior Publication Data

US 2017/0309450 A1    Oct. 26, 2017

Related U.S. Application Data

(63) Continuation of application No. 14/734,306, filed on Jun. 9, 2015, now Pat. No. 9,721,756.

(30) Foreign Application Priority Data

Jul. 2, 2014 (JP) ................................. 2014-136727
Mar. 12, 2015 (JP) ................................. 2015-049580

(51) Int. Cl.
*H01J 37/317* (2006.01)

(52) U.S. Cl.
CPC . *H01J 37/3174* (2013.01); *H01J 2237/31762* (2013.01); *H01J 2237/31764* (2013.01)

(58) Field of Classification Search
CPC ......... H01J 37/3174; H01J 2237/31762; H01J 2237/31764
See application file for complete search history.

(56) References Cited

U.S. PATENT DOCUMENTS 5,537,487 A * 7/1996 Miyajima ........... G06F 17/5081
                                                           348/87
5,894,057 A * 4/1999 Yamaguchi ......... H01J 37/3026
                                                          250/492.2

(Continued)

FOREIGN PATENT DOCUMENTS

JP    2008-218857     9/2008
JP    2009-64862      3/2009
KR    10-2012-0130137 A    11/2012

OTHER PUBLICATIONS

Office Action dated Apr. 20, 2016 in Korean Patent Application No. 10-2015-0092877 (with English language translation).

(Continued)

*Primary Examiner* — Wyatt Stoffa
(74) *Attorney, Agent, or Firm* — Oblon, McClelland, Maier & Neustadt, L.L.P.

(57) ABSTRACT

A charged particle beam writing apparatus includes a storage unit to store writing data of a region to be written in a target object, a first dividing unit to read the writing data and divide the region to be written into at least one first data processing region that overlaps with at least a first region where a pattern has been arranged, and at least one second data processing region that overlaps with a second region where no pattern is arranged without overlapping with the first region, a data processing unit to perform data processing of predetermined data processing contents for at least one first data processing region without performing the data processing for at least one second data processing region, and a writing unit to write a pattern on the target object, based on processed data.

2 Claims, 15 Drawing Sheets

(56) References Cited

U.S. PATENT DOCUMENTS

| | | | |
|---|---|---|---|
| 6,225,025 B1* | 5/2001 | Hoshino | B82Y 10/00 430/296 |
| 6,352,802 B1* | 3/2002 | Miyasaka | B82Y 10/00 430/296 |
| 6,415,432 B1* | 7/2002 | Saito | H01J 37/3026 250/492.22 |
| 7,750,324 B2* | 7/2010 | Oogi | B82Y 10/00 250/492.21 |
| 2002/0028398 A1* | 3/2002 | Ogino | B82Y 10/00 430/30 |
| 2002/0104970 A1* | 8/2002 | Winter | B82Y 10/00 250/400 |
| 2002/0115309 A1* | 8/2002 | Nakasuji | B82Y 10/00 438/800 |
| 2002/0116697 A1* | 8/2002 | Okamoto | G03F 1/20 716/53 |
| 2007/0114463 A1* | 5/2007 | Nakasugi | B82Y 10/00 250/492.23 |
| 2008/0001103 A1* | 1/2008 | Sugimura | B82Y 10/00 250/492.22 |
| 2008/0145767 A1* | 6/2008 | Lordi | B82Y 10/00 430/5 |
| 2009/0057575 A1* | 3/2009 | Oogi | B82Y 10/00 250/492.22 |
| 2011/0031387 A1* | 2/2011 | Nakayamada | B82Y 10/00 250/252.1 |
| 2011/0046762 A1* | 2/2011 | Yashima | B82Y 10/00 700/97 |
| 2011/0068281 A1* | 3/2011 | Hara | B82Y 10/00 250/492.22 |
| 2012/0014507 A1* | 1/2012 | Wu | A61N 5/10 378/65 |
| 2012/0286174 A1* | 11/2012 | Gomi | H01J 37/3026 250/492.3 |
| 2012/0292536 A1* | 11/2012 | Yashima | H01J 37/3174 250/492.22 |
| 2012/0292537 A1* | 11/2012 | Yashima | H01J 37/3174 250/492.22 |
| 2013/0037724 A1* | 2/2013 | Tsuruta | H01J 37/3045 250/397 |
| 2013/0065184 A1* | 3/2013 | Nishimura | G03F 1/44 430/296 |
| 2013/0134329 A1* | 5/2013 | Matsumoto | H01J 37/3174 250/492.22 |
| 2013/0157198 A1* | 6/2013 | Yoshikawa | G03F 7/2059 430/296 |
| 2013/0316288 A1* | 11/2013 | Nakayamada | G03F 7/2061 430/296 |
| 2014/0077103 A1* | 3/2014 | Matsumoto | H01J 37/317 250/492.3 |
| 2014/0097362 A1* | 4/2014 | Carroll | B82Y 40/00 250/492.22 |
| 2014/0114908 A1* | 4/2014 | Henrichs | G06F 17/30563 707/602 |
| 2014/0225008 A1* | 8/2014 | Yoshikawa | G03F 7/2059 250/492.3 |
| 2015/0120907 A1* | 4/2015 | Niestemski | H04L 67/1097 709/224 |
| 2015/0364291 A1* | 12/2015 | Ogawa | H01J 37/3174 250/491.1 |
| 2017/0229280 A1* | 8/2017 | Kato | H01J 37/147 |

OTHER PUBLICATIONS

Taiwanese Office Action dated Jul. 21, 2016, issued in Taiwanese Patent Application No. 104119422 (with English translation).
Decision of Refusal dated Aug. 31, 2016, issued in Korean Patent Application No. 10-2015-0092877 (with English translation).

* cited by examiner

CHARGED PARTICLE BEAM WRITING APPARATUS AND CHARGED PARTICLE BEAM WRITING METHOD

CROSS-REFERENCE TO RELATED APPLICATION

This application is a continuation of and claims the benefit of priority from U.S. application Ser. No. 14/734,306, filed Jun. 9, 2015, which claims the benefit of priority from the prior Japanese Patent Application No. 2014-136727 filed on Jul. 2, 2014 in Japan, and priority from the prior Japanese Patent Application No. 2015-049580 filed on Mar. 12, 2015 in Japan; the entire contents of which are incorporated herein by reference.

BACKGROUND OF THE INVENTION

Field of the Invention

Embodiments of the present invention relate generally to a charged particle beam writing apparatus and a charged particle beam writing method, and more specifically, relate to a method for achieving high-speed data processing in a writing apparatus.

Description of Related Art

In recent years, with high integration of LSI, the line width (critical dimension) required for circuits of semiconductor devices is becoming progressively narrower. As a method for forming an exposure mask (also called a reticle) used to form circuit patterns on these semiconductor devices, the electron beam (EB) writing technique having excellent resolution is employed.

FIG. 15 is a conceptual diagram explaining operations of a variable shaped electron beam (EB) writing or "drawing" apparatus. The variable shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system (e.g., refer to Japanese Patent Application Laid-open No. 2008-218857).

Generally, in an electron beam writing apparatus, in order to enhance the data processing efficiency, a writing region where patterns are to be arranged is divided into a plurality of processing regions. Then, in the writing apparatus, a distributed processing is carried out, namely data processing of a pattern arranged in each processing region is performed in parallel. For example, since the size that can be shaped by one beam shot is limited, a figure pattern defined in writing data is divided into a plurality of shot figures each of which can be shaped by one beam shot. In that case, in shot data generation processing, if dividing is performed so that respective processing regions may be the same size, since densities of patterns arranged in the respective processing regions are different from each other, processing time greatly varies depending upon the densities. Therefore, conventionally, in order to reduce the variability of the processing time, it has been contrived to perform division so that the number of shots in each processing region may be around the same (e.g., refer to JP2008-218857A).

Meanwhile, in the electron beam writing, dimensional variation represented by the proximity effect is corrected by adjusting an irradiation amount (dose). In that case, the corrected dose is represented in a dose map which has been divided into meshes.

Regarding a writing region, there is a case in which a somewhat large region without any pattern exists. In such a case, if dividing is performed such that the number of shots in each divided processing region may be around the same, the total processing region includes the large region without any pattern. Then, when generating shot data, since a beam dose for forming a shot figure concerned needs to be defined, the beam dose should be read from the dose map. If the processing region is large, the time period to read the dose from the map is long. That is, there is accordingly a problem that the processing time for a processing region including a region where no pattern exists is longer than that for a processing region which does not include a region where no pattern exists.

Further, when calculating a correction coefficient (correction dose) for the proximity effect, etc. so as to adjust a dose, calculation processing for obtaining an area density and calculation processing for correction of the proximity effect, etc. using the calculated area density are performed. In performing the area density calculation processing and the correction calculation processing, the writing region is divided, for each processing, into a plurality of processing regions, and then, the calculation is executed for each processing region. Even in the area density calculation processing, if dividing is also performed such that the size of each processing region is the same as each other, since densities of patterns arranged in respective processing regions are different from each other, there is great variability among processing time of the respective processing regions. Therefore, conventionally, dividing is performed such that the number of shots in each processing region is around the same in order to reduce the variability of the processing time. Moreover, even in the area density calculation processing, if dividing is also performed such that the number of shots in each processing region is around the same, the total processing region includes a large region without any pattern. On the other hand, in the calculation processing for correction of the proximity effect, etc., since there is no or small amount of variability of the processing time which usually occurs due to various densities of patterns, dividing is performed so that each processing region may be the same size. However, in the proximity effect correction calculation processing, it is necessary to read a calculated area density. If the processing region of the area density calculation processing is large, with respect to the proximity effect correction calculation processing of a processing region which even partly overlaps with the large processing region of the area density calculation processing, the time period to read the area density becomes long. This consequently generates a problem in that the processing time for a processing region including a region where no pattern exists is longer than that for a processing region which does not include a region where no pattern exists.

BRIEF SUMMARY OF THE INVENTION

According to one aspect of the present invention, a charged particle beam writing apparatus includes a storage unit configured to store writing data of a region to be written in a target object, a first dividing unit configured to read the writing data and divide the region to be written into at least one first data processing region that overlaps with at least a first region where a pattern has been arranged, and at least one second data processing region that overlaps with a second region where no pattern is arranged without overlapping with the first region, a data processing unit configured to perform data processing of predetermined data processing contents for the at least one first data processing region without performing the data processing for the at least one second data processing region, and a writing unit configured to write a pattern on the target object, based on the data processed.

According to another aspect of the present invention, a charged particle beam writing method includes reading writing data of a region to be written in a target object and dividing the region to be written into at least one first data processing region that overlaps with at least a first region where a pattern has been arranged, and at least one second data processing region that overlaps with a second region where no pattern is arranged without overlapping with the first region, performing data processing of predetermined data processing contents for the at least one first data processing region without performing the data processing in the at least one second data processing region, and writing a pattern on the target object, based on the data processed.

Moreover, according to another aspect of the present invention, a charged particle beam writing apparatus includes a storage unit configured to store writing data of a region to be written in a target object, a dividing unit configured to read the writing data and divide the region to be written into a plurality of stripe regions each being in a strip shape, a pattern existence determination unit configured to determine, for each of the plurality of stripe regions, whether a pattern is arranged in a stripe region concerned in the plurality of stripe regions, a combining unit configured to combine successive stripe regions which have been determined to be without any pattern, as one no-pattern stripe region in the plurality of stripe regions, a data processing unit configured to perform data processing of predetermined data processing contents for stripe regions which are not combined, without performing the data processing for the no-pattern stripe region, and a writing unit configured to write a pattern on the target object, based on processed data.

Furthermore, according to another aspect of the present invention, a charged particle beam writing method includes reading writing data of a region to be written in a target object, and dividing the region to be written into a plurality of stripe regions each being in a strip shape, determining, for each of the plurality of stripe regions, whether a pattern is arranged in a stripe region concerned in the plurality of stripe regions, combining successive stripe regions which have been determined to be without any pattern, as one no-pattern stripe region in the plurality of stripe regions, performing data processing of predetermined data processing contents for stripe regions which are not combined, without performing the data processing for the no-pattern stripe region, and writing a pattern on the target object, based on processed data.

DETAILED DESCRIPTION OF THE INVENTION

In the following embodiments, there will be described an apparatus and method that can inhibit the prolongation of the processing time caused by a region where no pattern exists.

In the following embodiments, there will be described a configuration in which an electron beam is used as an example of a charged particle beam. The charged particle beam is not limited to the electron beam, and other charged particle beam such as an ion beam may also be used. Moreover, a variable shaped beam (VSB) writing apparatus will be described as an example of a charged particle beam apparatus.

First Embodiment

Figure 1:
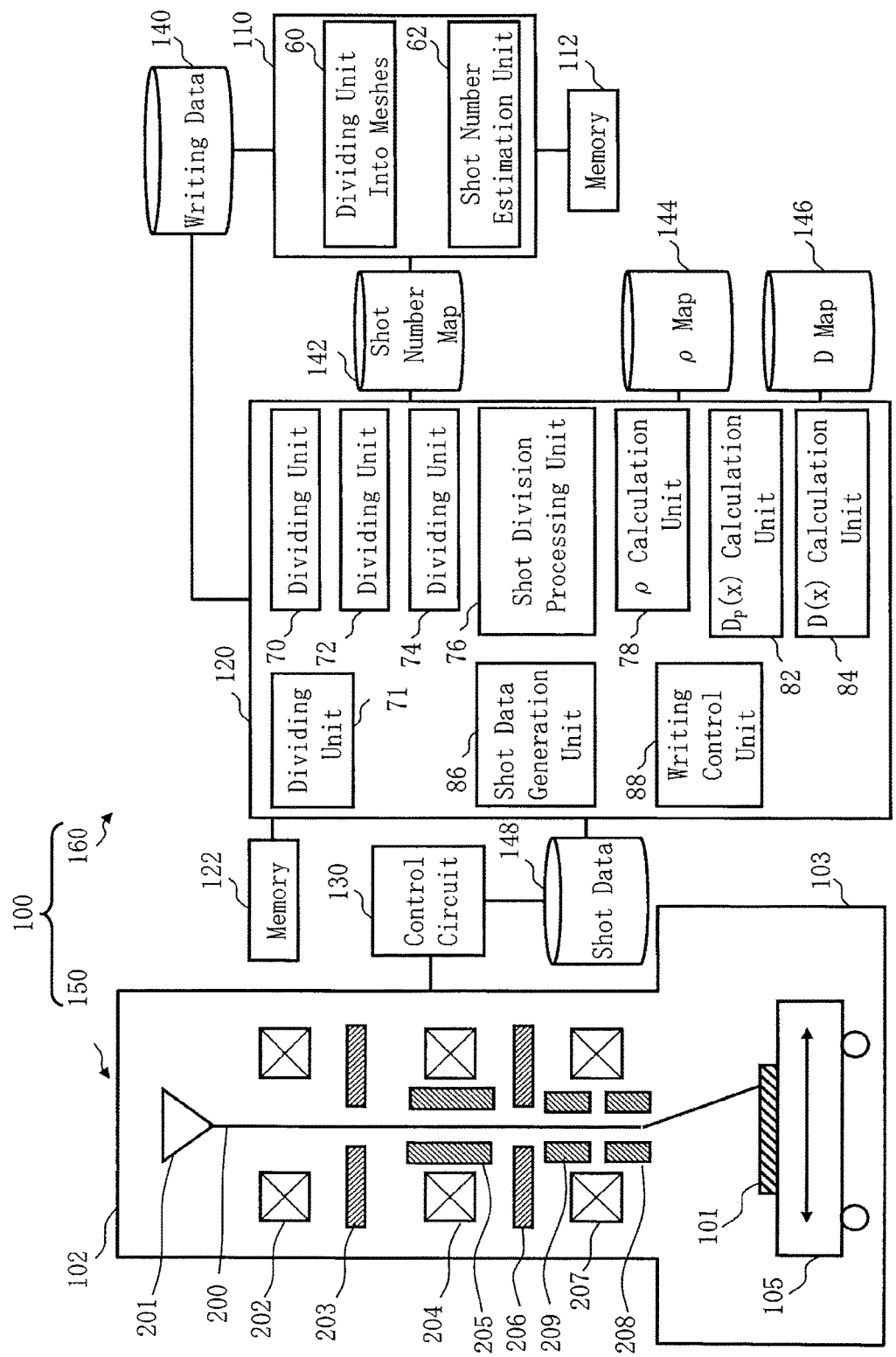
FIG. 1 is a schematic diagram showing a configuration of a writing apparatus according to a first embodiment.

FIG. 1 is a schematic diagram showing the configuration of a writing or "drawing" apparatus according to the first embodiment. As shown in FIG. 1, a writing apparatus 100 includes a writing unit 150 and a control unit 160. The writing apparatus 100 is an example of a charged particle beam writing apparatus, and especially, an example of a variable shaped beam writing apparatus. The writing unit 150 includes an electron optical column 102 and a writing chamber 103. In the electron optical column 102, there are arranged an electron gun assembly 201, an illumination lens 202, a first aperture plate 203, a projection lens 204, a deflector 205, a second aperture plate 206, an objective lens 207, a main deflector 208 and a sub deflector 209. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices. The target object 101 may be, for example, a mask blank on which resist has been applied and nothing has yet been written.

The control unit 160 includes a control computer 110 (preprocessing computer), a memory 112, a control computer 120, a memory 122, a control circuit 130, and a storage devices 140, 142, 144, 146, and 148 such as magnetic disk drives. The control computer 110, the memory 112, the control computer 120, the memory 122, the control circuit 130, and the storage devices 140, 142, 144, 146, and 148 are connected with each other through a bus (not shown).

In the control computer 110, there are arranged a dividing unit 60 into meshes and a shot number estimation unit 62. Functions, such as the dividing unit 60 into meshes and the shot number estimation unit 62 may be configured by hardware such as an electric circuit, or by software such as a program causing a computer to implement these functions. Alternatively, they may be configured by a combination of hardware and software. Data which is input and output to/from the dividing unit 60 into meshes and the shot number estimation unit 62, and data being operated are stored in the memory 112 each time.

In the control computer 120, there are arranged dividing units 70, 71, 72, and 74, a shot division processing unit 76, an area density calculation unit 78, a coefficient calculation unit 82 for proximity-effect-corrected irradiation, a dose calculation unit 84, a shot data generation unit 86, and a writing control unit 88. These functions described above may be configured by hardware such as an electric circuit, or by software such as a program causing a computer to implement these functions. Alternatively, they may be configured by a combination of hardware and software. Data which is input and output to/from the dividing units 70, 71, 72, and 74, the shot division processing unit 76, the area density calculation unit 78, the coefficient calculation unit 82 for proximity-effect-corrected irradiation, the dose calculation unit 84, the shot data generation unit 86, and the writing control unit 88, and data being operated are stored in the memory 122 each time.

Writing data of the region to be written in the target object 101 is input from the outside and stored in the storage device 140. For example, writing data for each stripe region to be described later is stored in the storage device 140.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection. Input devices, such as a mouse and a keyboard, a monitoring device, an external interface circuit and the like may be connected to the writing apparatus 100.

Figure 2:
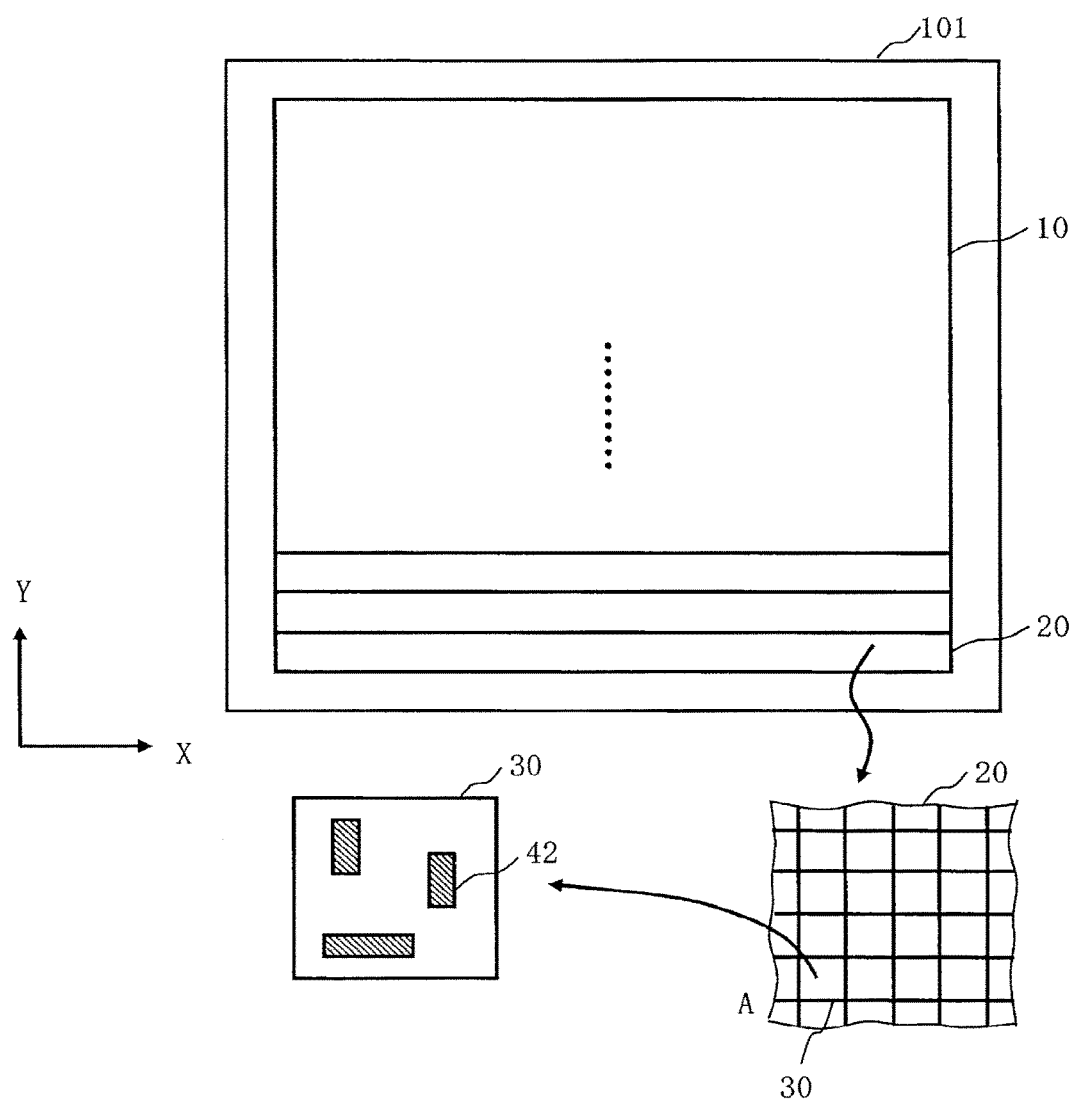
FIG. 2 is a conceptual diagram for explaining each region according to the first Embodiment.

FIG. 2 is a conceptual diagram for explaining each region according to the first Embodiment. As shown in FIG. 2, a writing region 10 of the target object 101 is virtually divided by the dividing unit 71 into a plurality of stripe regions 20 each being in a strip shape and each having a width deflectable in the y direction by the main deflector 208. Further, each of the stripe regions 20 is virtually divided into a plurality of subfields (SFs) 30 (small regions) each having a size deflectable by the sub deflector 209. A shot FIG. 42 is to be written at a corresponding shot position in each SF 30.

Figure 3:
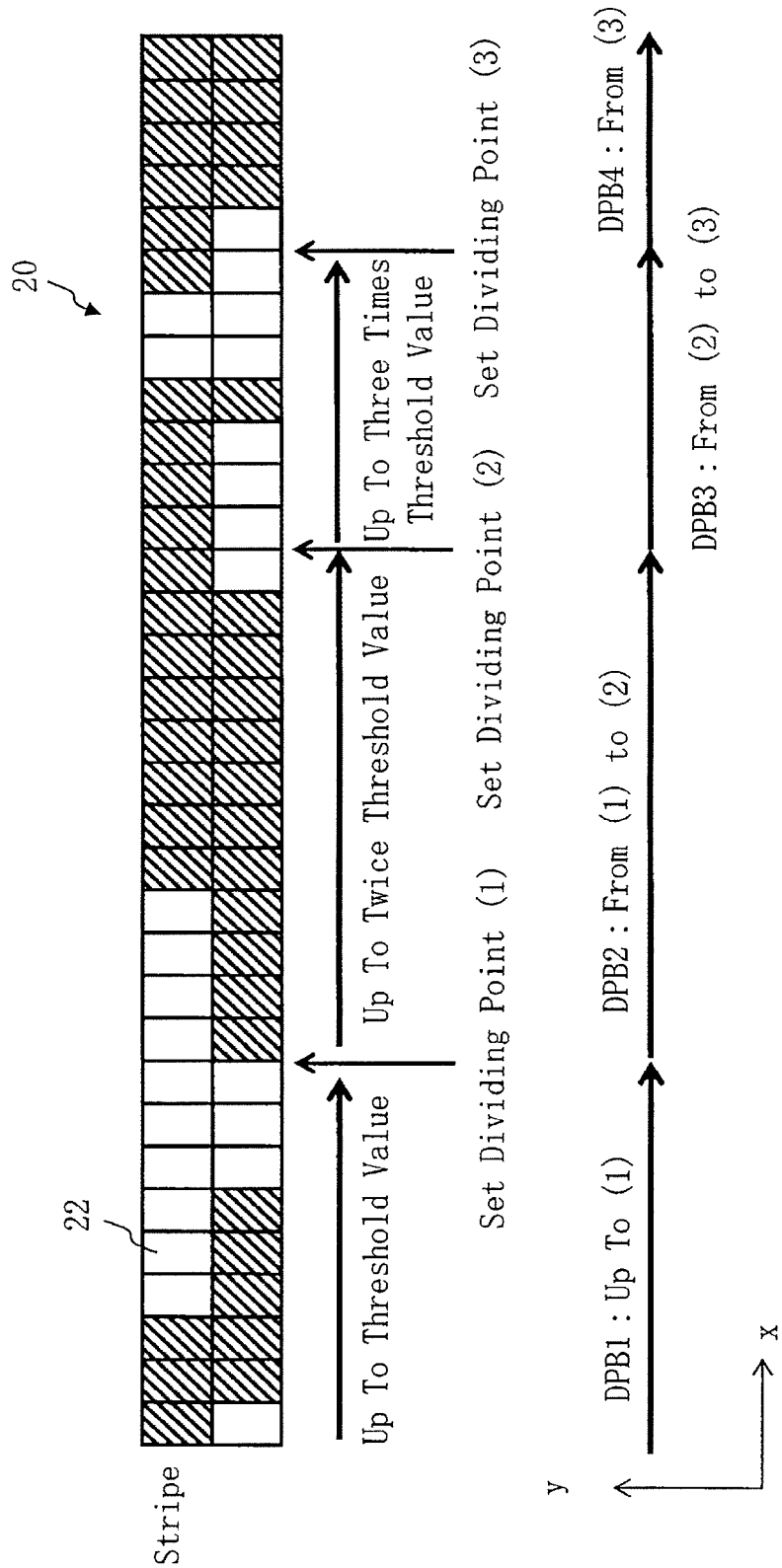
FIG. 3 illustrates an example of a processing region according to the first embodiment.

FIG. 3 illustrates an example of a processing region according to the first embodiment. As shown in FIG. 3, the stripe region 20 is used as a unit region for writing. In the first embodiment, writing processing is performed in each stripe region 20. Therefore, data processing is also performed for each stripe region 20. In the case of FIG. 3, a certain stripe region 20 is divided into a plurality of shot number estimation meshes 22. As to be described later, the number of shot figures in a mesh is measured for each shot number estimation mesh 22 in the control computer 110 in order to estimate and define the number of shots in each shot number estimation mesh 22. FIG. 3 shows hatched shot number estimation meshes 22 in each of which a shot figure (pattern) exists and not-hatched shot number estimation meshes 22 in each of which no pattern exists. In the case of FIG. 3, there exists no somewhat large region in which a pattern is not arranged, in the stripe region 20. In such a case, for example, the number of shots is counted from the writing starting side end (e.g., the left side end in FIG. 3) of the stripe region 20, and every time the counted number exceeds a threshold value, division is performed into processing regions (DPBs). In the example of FIG. 3, the number of shots is counted from the left end of the stripe region 20, and the position where the counted shot number exceeds the threshold value for the first time is set as a dividing point (1) (dividing position). The region from the left end of the stripe region 20 to the dividing point (1) is defined as a processing region (DPB) 1. Next, the number of shots is counted from the left end of the stripe region 20, and the position where the counted shot number exceeds twice the threshold value is set as a dividing point (2) (dividing position). The region from the right side end (dividing point (1)) of the DPB 1 to the dividing point (2) is defined as a DPB 2. Similarly, the number of shots is counted from the left end of the stripe region 20, and the position where the counted shot number exceeds three times the threshold value is set as a dividing point (3) (dividing position). The region from the right side end (dividing point (2)) of the DPB 2 to the dividing point (3) is defined as a DPB 3. Further, the number of shots is counted from the left end of the stripe region 20, and if it comes to the end of the stripe region 20 before the counted shot number exceeds four times the threshold value, the region from the right side end (dividing point (3)) of the DPB 3 to the end of the stripe region 20 is defined as a DPB 4. By performing dividing as described above, the stripe region 20 can be divided into a plurality of processing regions each of which has approximately the same number of shots.

Figure 4:
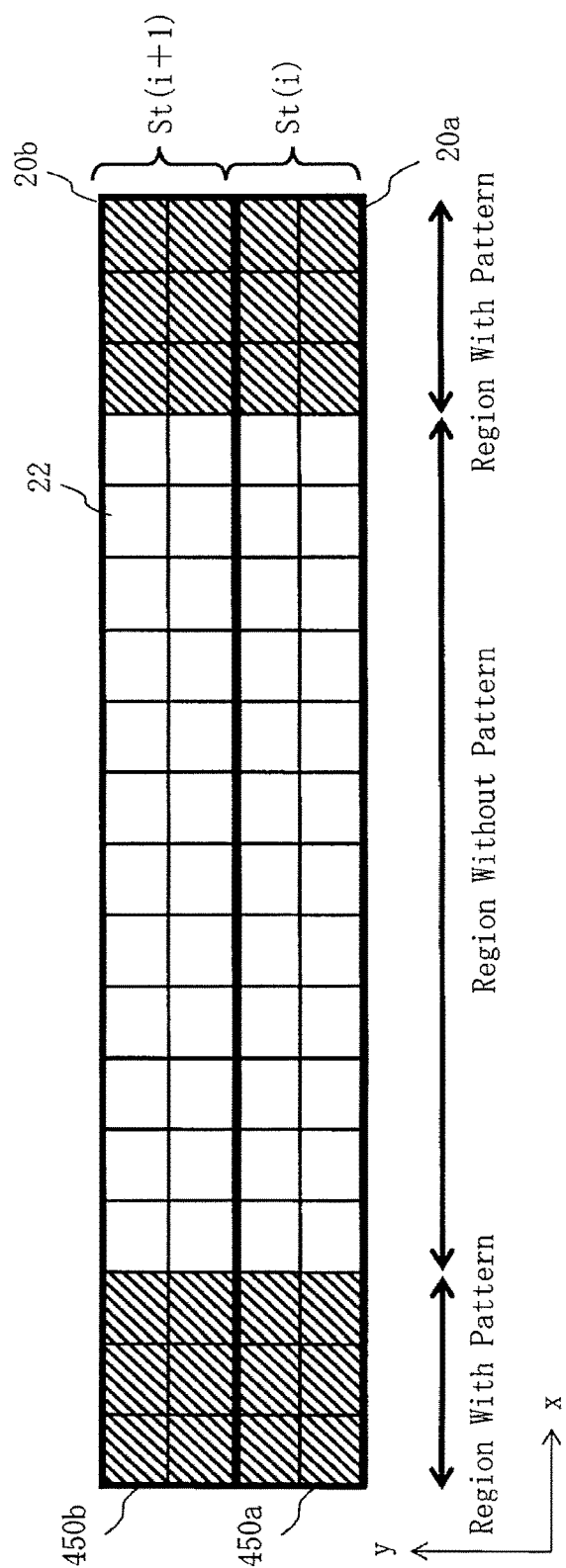
FIG. 4 illustrates a division example of a processing region for generating shot data according to a comparative example A of the first embodiment.

FIG. 4 illustrates a division example of a processing region for generating shot data according to the comparative example A of the first embodiment. FIG. 4 shows two stripe regions, the i-th stripe region 20a and the (i+1)th stripe region 20b, which are adjacent to each other. In the example of FIG. 4, the regions (first regions) in which patterns have been arranged exist at the both ends of the stripe region 20a, and a somewhat large region (second region) in which no pattern is arranged exists in the central part of the stripe region 20a. The same applies to the stripe region 20b. In the comparative example A, as in the conventional case, the number of shots is counted simply from the left end of the stripe region 20a (or stripe region 20b), and then, the processing region is divided, treating the position where the counted shot number exceeds the threshold value for generating shot data as a dividing point (dividing position). When the central part region in which no pattern exists is large, even if the number of shots is counted from the left end to the termination (right end) of the stripe region 20a, there is a possibility that the counted shot number does not exceed the threshold value. In that case, as shown in FIG. 4, the entire stripe region 20a turns out to be one processing region 450a. Similarly, the entire stripe region 20b turns out to be one processing region 450b. As described above, when generating shot data, it is necessary to calculate a beam dose for forming a shot figure concerned. Then, the dose needs to be read. Therefore, the time period to read the dose becomes long when the processing region is large, and thus, there is accordingly a problem that the processing time for the processing region 450a which includes the region without any pattern is longer than the processing time of one of the DPBs 1 to 3 or any other one of the DPBs 1 to 3.

Figure 5:
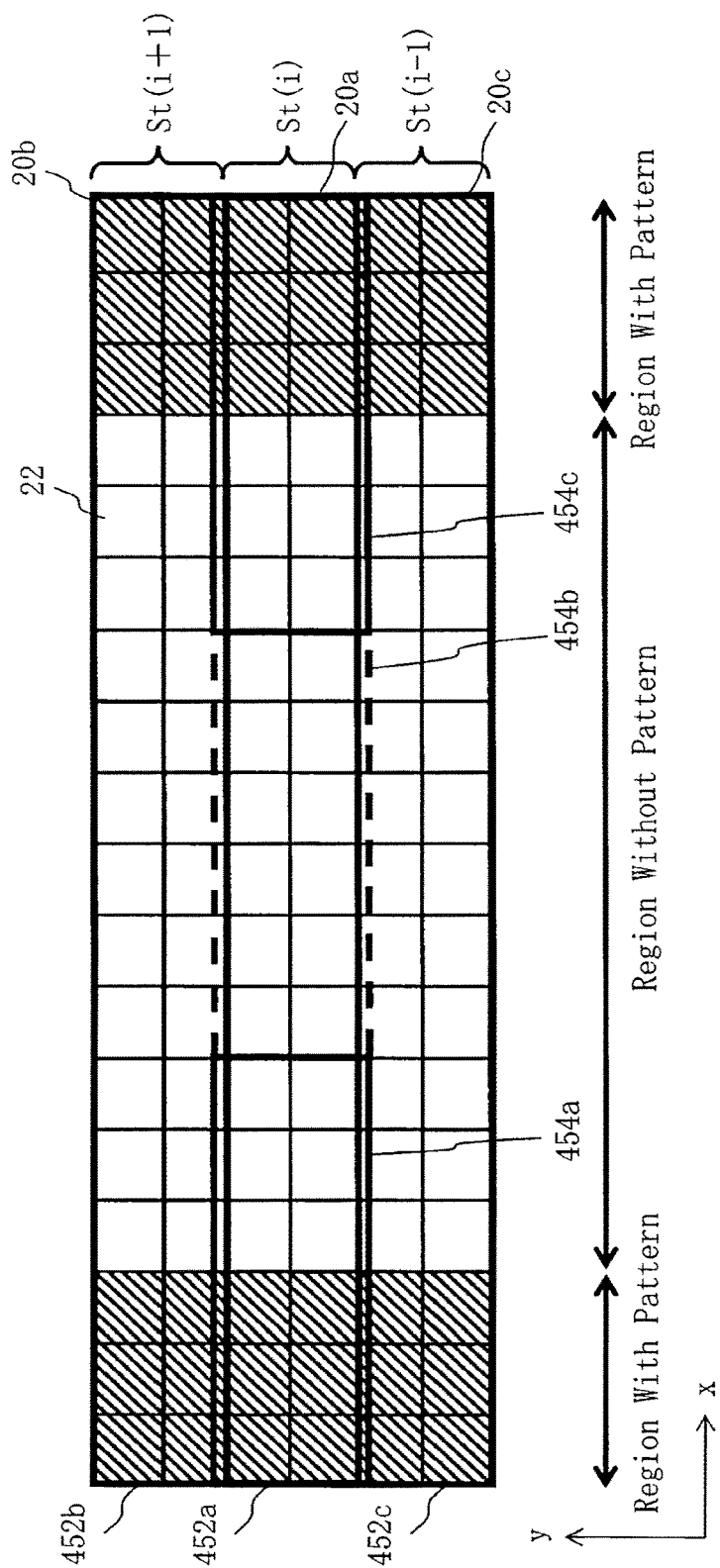
FIG. 5 illustrates a division example of a processing region for calculating a coefficient for correcting irradiation according to the comparative example A of the first embodiment.

FIG. 5 illustrates a division example of a processing region for calculating a coefficient for correcting irradiation according to the comparative example A of the first embodiment. The case of FIG. 5 shows three stripe regions, the i-th stripe region 20a, the (i+1)th stripe region 20b, and the (i−1)th stripe region 20c, which are adjacent to each other. In the example of FIG. 5, the regions (first regions) in which patterns have been arranged exist at the both ends of the stripe region 20a, and a somewhat large region (second region) in which no pattern is arranged exists in the central part of the stripe region 20a. The same applies to the stripe regions 20b and 20c. In the comparative example A, as in the conventional case, the number of shots is counted simply from the left end of the stripe region 20a (or stripe region 20b or 20c), and then, the processing region is divided, treating the position where the counted shot number exceeds the threshold value for calculating an area density as a dividing point (dividing position). When the central part region in which no pattern exists is large, even if the number of shots is counted from the left end to the termination (right end) of the stripe region 20a, there is a possibility that the counted shot number does not exceed the threshold value. In that case, as shown in FIG. 5, the entire stripe region 20a turns out to be one processing region 452a. Similarly, the entire stripe region 20b turns out to be one processing region 452b, and the entire stripe region 20c turns out to be one processing region 452c. On the other hand, in the calculation processing for correction of the proximity effect, etc., since there is no or small amount of variability of the processing time which usually occurs due to various densities of patterns, dividing is performed so that each processing region may be the same size. In such a case, as shown in FIG. 5, the stripe region 20a is divided into three processing regions 454a, 454b, and 454c each having the same width. The same applies to the stripe regions 20b and 20c. In the calculation processing for correction of the proximity effect, a calculated area density needs to be read. Therefore, for example, when performing correction calculation for the proximity effect in the processing region 454a, it is necessary to read data of the entire processing region 452a which is for area density, and to extract a required area density therefrom. Accordingly, if the processing region 452a for area density is large, the time period to read an area density becomes long in the calculation processing for correction of the proximity effect in the processing region which even partly overlaps with the processing region for the area density calculation processing. Consequently, the processing time of the processing region for the proximity effect correction calculation becomes long. Moreover, in the processing region 454b, conventionally, the proximity effect correction calculation has been performed though no pattern is arranged in that region. Therefore, the processing time for it has been needed.

Then, according to the first embodiment, dividing is performed so that the processing region may be divided into a region (first region) in which a pattern has been arranged, and a region (second region) in which no pattern is arranged. This makes it possible to avoid that the whole of the region without any pattern, whose width is wider than a predetermined size, is included in one processing region (DPB).

Figure 6:
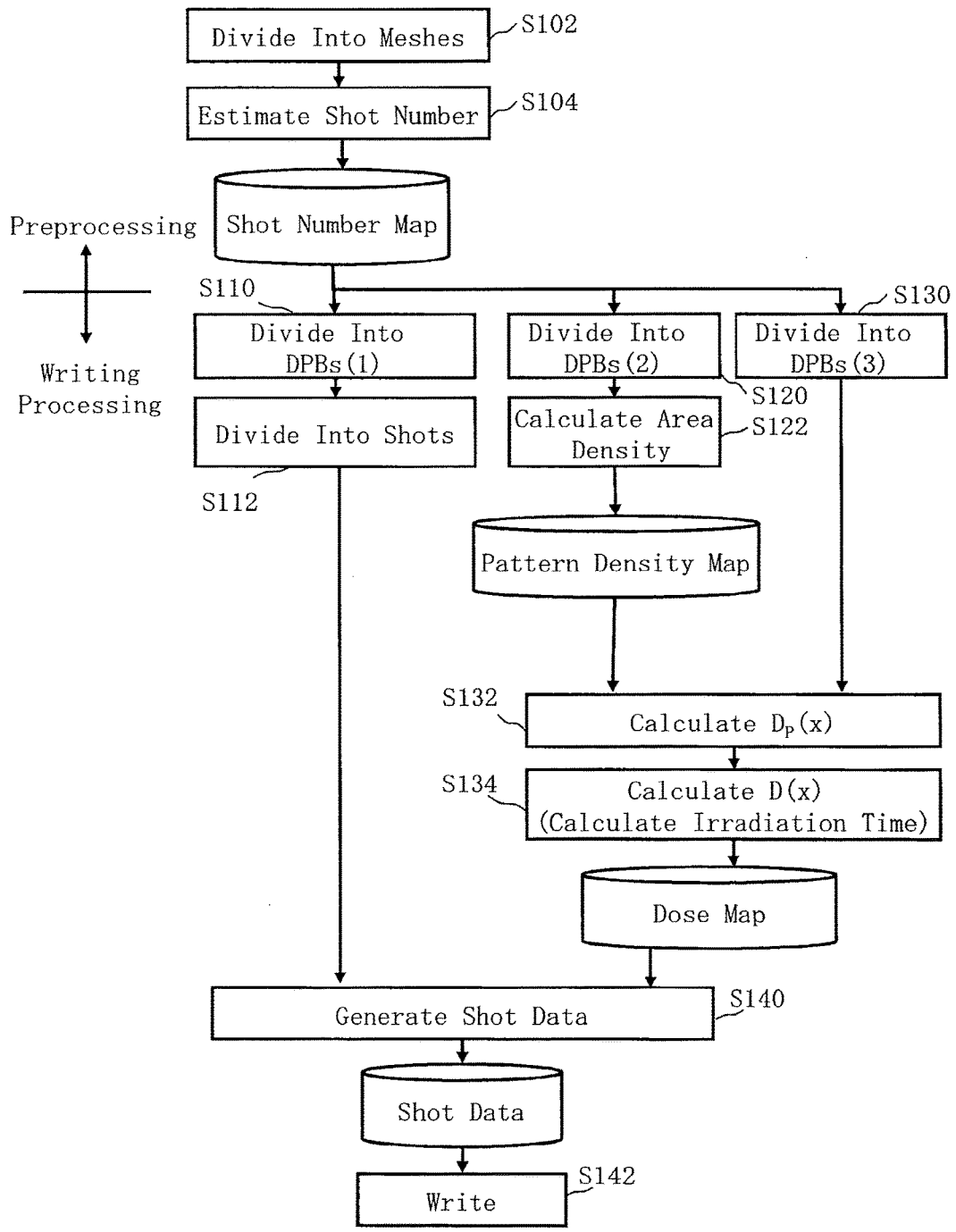
FIG. 6 is a flowchart showing main steps of a writing method according to the first embodiment.

FIG. 6 is a flowchart showing main steps of a writing method according to the first embodiment. As shown in FIG. 6, the writing method of the first embodiment executes a series of steps: a dividing step (S102) into meshes, a shot number estimation step (S104), a dividing step (S110) into DPBs (1), a dividing step (S112) into shots, a dividing step (S120) into DPBs (2), an area density calculation step (S122), a dividing step (S130) into DPBs (3), a coefficient calculation step (S132) for proximity-effect-corrected irradiation, a dose calculation step (S134) (irradiation time calculation step), a shot data generation step (S140), and a writing step (S142). The dividing step (S102) into meshes and the shot number estimation step (S104) are executed as preprocessing before starting writing processing.

In the dividing step (S102) into meshes, the dividing unit 60 into meshes (second dividing unit) divides the region to be written in the target object 101 into a plurality of mesh regions of a predetermined size. For example, each stripe region 20 is divided into a plurality of mesh regions, which is performed for estimating the number of shots. Therefore, for each stripe region 20, the stripe region 20 concerned is divided into a plurality of shot number estimation meshes 22. The size of the shot number estimation mesh 22 may be set appropriately on a case-by-case basis. For example, it is preferable for the size to be 1/n of the division width (short side size) of the stripe region 20. For example, preferably, it is about 1/10 to 1/20. Alternatively, dividing is performed by the same size as the subfield 30 shown in FIG. 2.

In the shot number estimation step (S104), the shot number estimation unit 62 reads writing data from the storage device 140, and assigns, for each shot number estimation mesh 22, a figure pattern which is to be arranged in the shot number estimation mesh 22 concerned. The figure pattern assigned to each shot number estimation mesh 22 is divided into shot figures. For example, the figure pattern may be divided, by a preset maximum shot size, into figures such as a quadrangle or an isosceles right triangle which can be shaped by the writing apparatuses 100. Then, the number of divided shot figures is counted, and the number of shot figures, i.e., the number of shots, for each shot number estimation mesh 22 is estimated. By using each estimated number of shots as a map value of a corresponding shot number estimation mesh 22, a shot number map is generated. The shot number map is stored in the storage device 142.

In the dividing step (S110) into DPBs (1), the dividing unit 70 (first dividing unit) reads writing data from the storage device 140, and divides a region to be written, such as the stripe region 20, into a plurality of data processing regions (DPBs) (1). Here, the processing region (DPB) (1) for dividing processing into shots (shot data generation processing) is formed.

Figure 7:
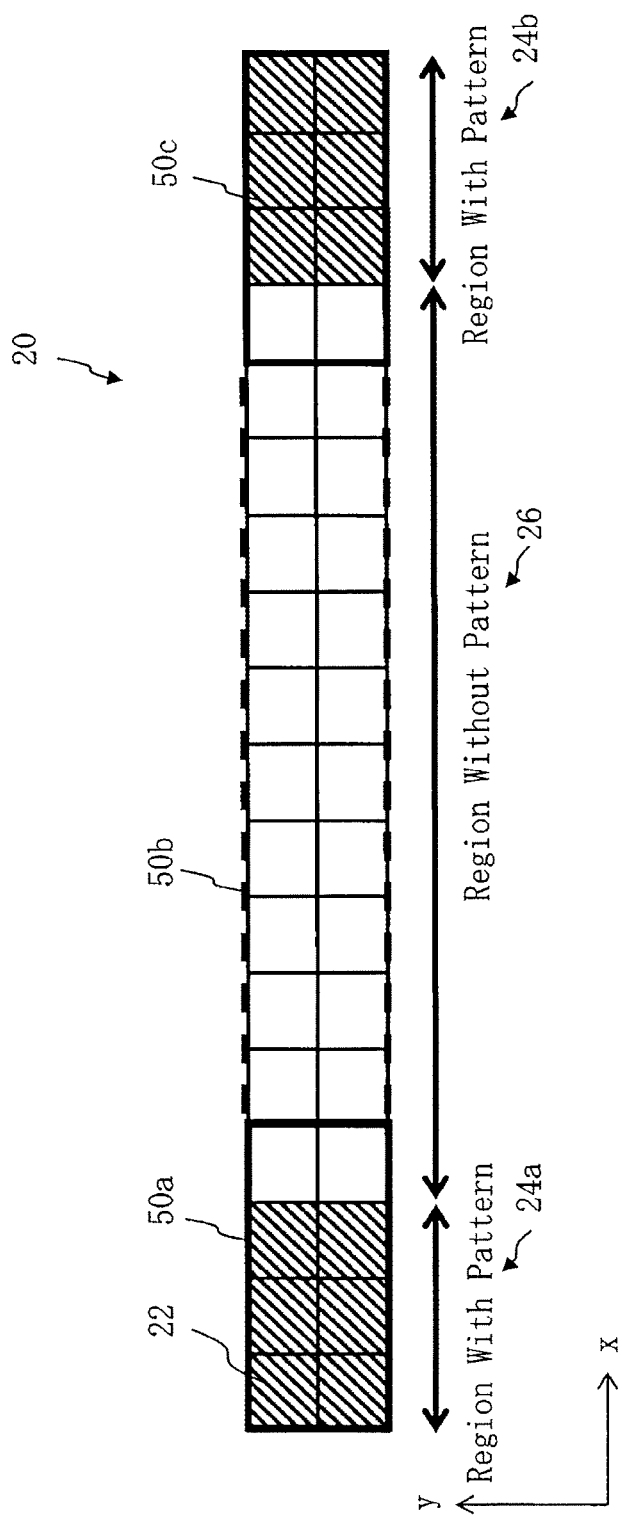
FIG. 7 shows a division example of a processing region for shot data generation processing according to the first embodiment.

FIG. 7 shows a division example of a processing region for shot data generation processing according to the first embodiment. As shown in FIG. 7, according to the first embodiment, the dividing unit 70 divides a region to be written, such as the stripe region 20, into data processing regions 50a and 50c (first data processing regions) that respectively overlap with at least the regions 24a and 24b (first regions) in each of which a pattern has been arranged, and a data processing region 50b (second data processing region) that overlaps with the region 26 (second region) in which no pattern is arranged, without overlapping with the regions 24a and 24b where patterns are arranged. In the case of FIG. 7, at both the ends of the stripe region 20, there are aligned shot number estimation meshes 22 (meshes which are hatched) whose numbers of shots are not zero (that is, a pattern has been arranged therein). On the other hand, in the central part of the stripe region 20, there are aligned, in a large range, shot number estimation meshes 22 (meshes which are not hatched) each of whose number of shots is zero (that is, a pattern has not been arranged). In that case, according to the first embodiment, the data processing region 50a is formed at the position overlapping with at least the region 24a and including, as a margin, the shot number estimation meshes 22 of one or a few columns arrayed in the x direction (or "rows" arrayed in the y direction in FIG. 7) at the region 26 side close to the region 24a. Moreover, the data processing region 50c is formed at the position overlapping with at least the region 24b and including, as a margin, the shot number estimation meshes 22 of one or a few columns at the region 26 side close to the region 24b. Further, the data processing region 50b which does not overlap with the regions 24a and 24b but overlaps with the region 26 is formed.

Although the example of FIG. 7 shows the case where the regions 24 with patterns exist at both the ends of the stripe region 20, it is not limited thereto. For example, there is a possibility that the region 24 with a pattern exists only at one end. Moreover, there is a possibility that the region 24 with a pattern exists only in the central part of the stripe region 20. Alternatively, a plurality of regions 24 with patterns and regions 26 without any pattern may exist in a mixed manner. Thus, the dividing unit 70 divides a region to be written into at least one data processing region 50a which overlaps with at least the region 24 (first region: region with a pattern) where a pattern has been arranged, and at least one data processing region 50b which overlaps with the region 26 (second region: region without any pattern) where no pattern is arranged, without overlapping with the region 24.

Figure 8:
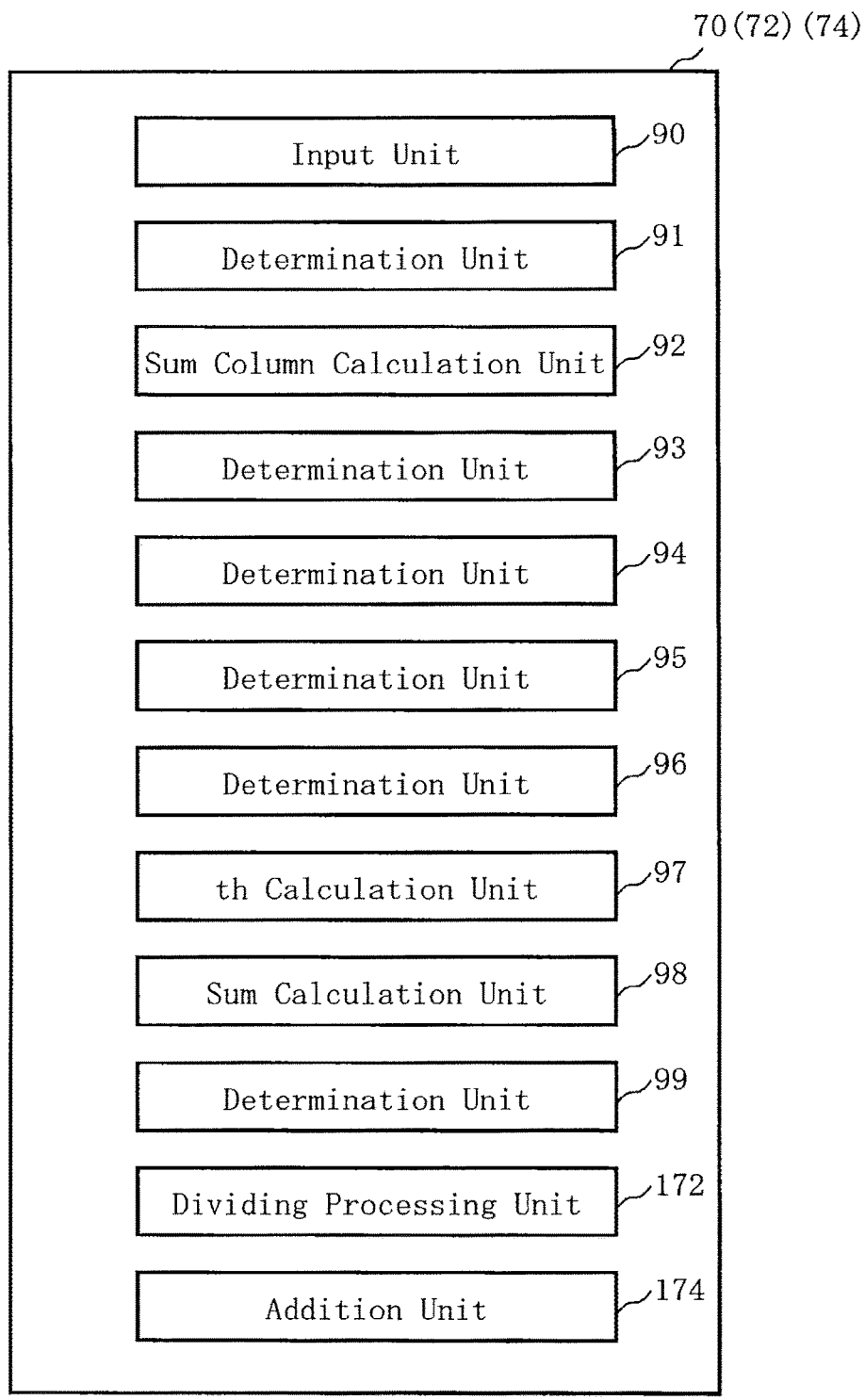
FIG. 8 is a schematic diagram showing an internal structure of a dividing unit according to the first embodiment.

FIG. 8 is a schematic diagram showing the internal structure of a dividing unit according to the first embodiment. As shown in FIG. 8, the dividing unit 70 includes an input unit 90, a determination unit 91, a column total shot number (Sum column) calculation unit 92, determination units 93, 94, 95, and 96, a threshold value (th) calculation unit 97, a sum total shot number (Sum) calculation unit 98, a determination unit 99, a dividing processing unit 172, and an addition unit 174. These functions described above may be configured by hardware such as an electric circuit, or by software such as a program causing a computer to implement these functions. Alternatively, they may be configured by a combination of hardware and software. Data which is input and output to/from the input unit 90, the determination unit 91, the column total shot number (Sum column) calculation unit 92, the determination units 93, 94, 95, and 96, the threshold value (th) calculation unit 97, the sum total shot number (Sum) calculation unit 98, the determination unit 99, the dividing processing unit 172, and the addition unit 174, and data being operated are stored in the memory 122 each time. Although herein the dividing unit 70 of FIG. 1 is shown, each of the dividing units 72 and 74 has the same internal structure as that of the dividing unit 70.

Figure 9:
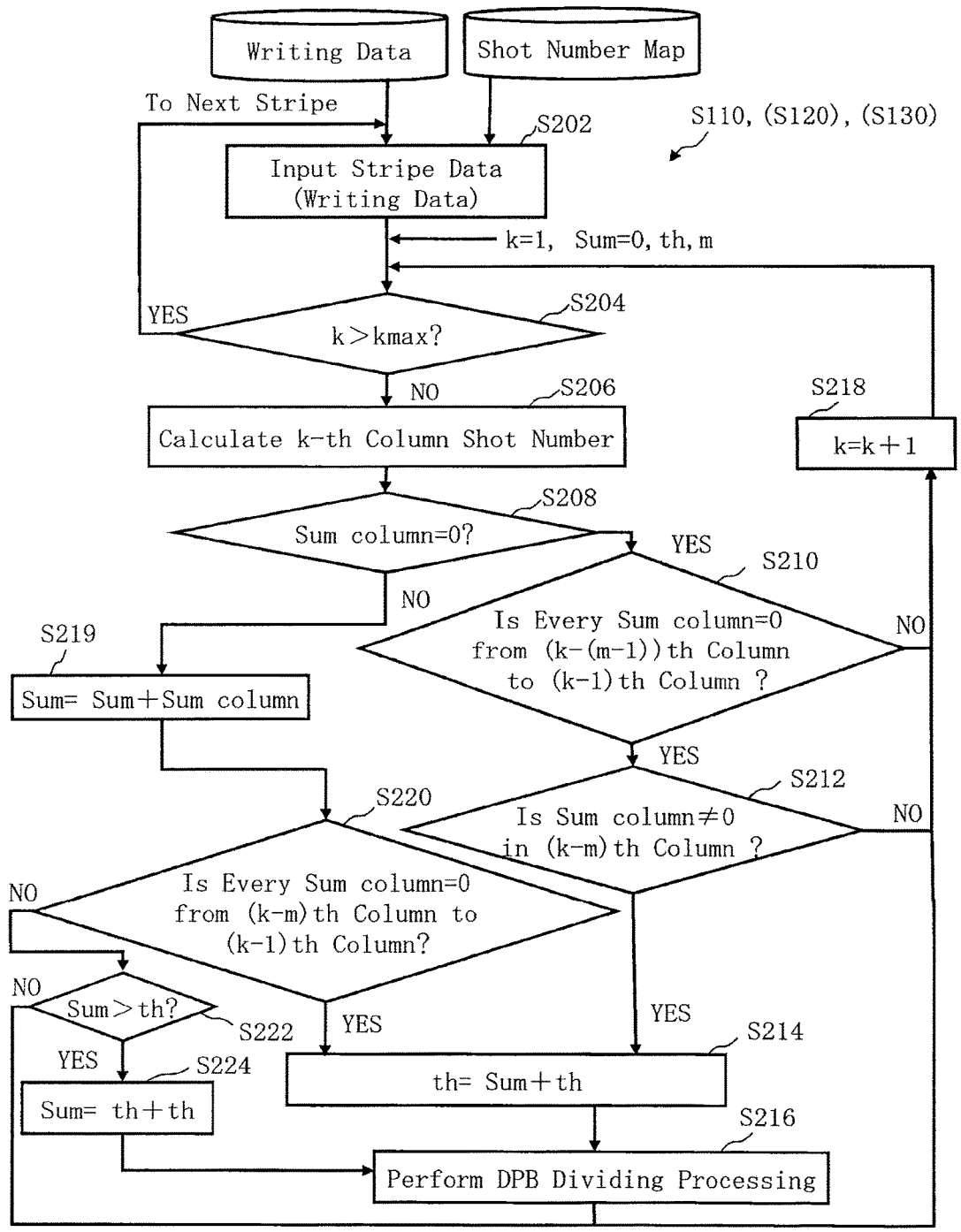
FIG. 9 is a flowchart showing internal steps of the dividing step into DPBs (1) according to the first embodiment.

FIG. 9 is a flowchart showing internal steps of the dividing step into DPBs (1) according to the first embodiment. In FIG. 9, the dividing step (S110) into DPBs (1) executes a series of steps as internal steps: an input step (S202), a determination step (S204), a k-th column total shot number calculation step (S206), determination steps (S208), (S210), and (S212), a threshold value calculation step (S214), a dividing processing step (S216), an addition step (S218), a sum total shot number calculation step (S219), determination steps (S220) and (S222), and a threshold value calculation step (S224). Although the dividing step (S110) into DPBs (1) of FIG. 6 is herein shown, each of the dividing step (S120) into DPBs (2) and the dividing step (S130) into DPBs (3) executes the same internal steps as those of the dividing step (S110) into DPBs (1).

Figure 10:
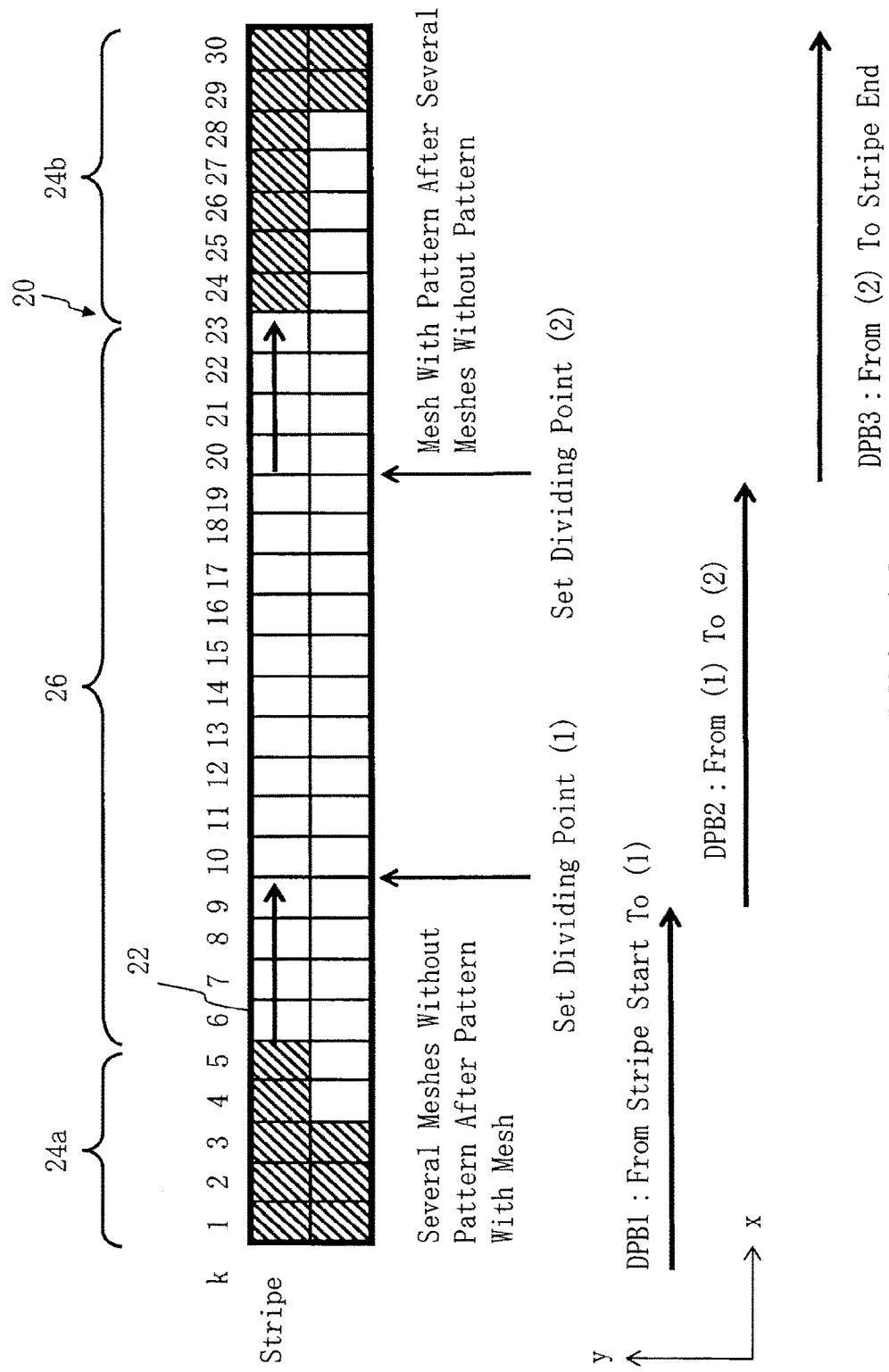
FIG. 10 is a schematic diagram describing a method of dividing into DPBs according to the first embodiment.

FIG. 10 is a schematic diagram describing a method of dividing into DPBs according to the first embodiment. The example of FIG. 10 shows the case where the total number of shots in the region 24a does not exceed a threshold value th which is for dividing the processing region.

In the input step (S202), the input unit 90 inputs writing data (stripe data) of the stripe region 20 concerned from the storage device 140. Moreover, the input unit 90 inputs a shot number map in which the number of shots estimated for each shot number estimation mesh 22 is defined from storage device 142.

The k-th column in the x direction from the left end of the stripe region 20 concerned in the shot number estimation meshes 22 is defined as the k-th shot number estimation mesh 22 column. For each shot number estimation mesh 22 column, n shot number estimation meshes 22 have been formed in the y direction in the dividing step (S102) into meshes.

When starting the dividing step (S110) into DPBs (1), 1 is set as an initial value of k, and 0 is set as an initial value of a sum total shot number Sum. Moreover, the threshold value th (threshold value for dividing processing into shots) of the number of shots to be used when dividing the stripe region 20 into at least one processing region is set in advance. Moreover, a column value m for setting a margin (margin column value) (value for dividing processing into shots) is also set in advance.

In the determination step (S204), the determination unit 91 determines whether a column number k of the shot number estimation mesh 22 column of the stripe region 20 which is a target to be determined is larger than the last column kmax. When the column number k is larger than the last column kmax, it returns to the input step (S202), and inputs the next stripe data. When the column number k is not larger than the last column kmax, it proceeds to the k-th column total shot number calculation step (S206).

In the k-th column total shot number calculation step (S206), the column total shot number (Sum column) calculation unit 92 calculates a k-th column total shot number (Sum column) that serves as a sum total value of the number of shots defined for the k-th shot number estimation mesh 22 column which is the k-th column in the x direction from the left end of the stripe region 20 to be determined.

In the determination step (S208), the determination unit 93 determines whether the calculated k-th column total shot number (Sum column) is zero. In the example of FIG. 10, in the case of k=1, since there are two shot number estimation meshes 22, for each of which the number of shots being not 0 is defined, in the first mesh column 22, it is determined that Sum column is not zero. For example, in the case of k=4, since a shot number estimation mesh 22 for which the number of shots being not 0 is defined and a shot number estimation mesh 22 for which the number of shots being 0 is defined are mixed in the fourth mesh column 22, it is determined that Sum column is not zero. On the other hand, in the cases of k=6 to 23, since there are two shot number estimation meshes 22, for each of which the number of shots being 0 is defined, in each of the sixth to twenty-third mesh columns 22, it is determined that Sum column is zero. When Sum column is zero, it proceeds to the determination step (S210). When Sum column is not zero, it proceeds to the sum total shot number calculation step (S219).

In the determination step (S210), the determination unit 94 determines whether every Sum column of from the (k−(m−1))th column to the (k−1)th column is zero. Now, there will be described a case where the margin column value m is set as m=4. In the example of FIG. 10, with respect to k=6, no Sum column is zero in the third to fifth mesh 22 columns. With respect to k=7, although no Sum column is zero in the fourth and fifth mesh 22 columns, Sum column is zero in the sixth mesh 22 column. With respect to k=9, every Sum column is zero in the sixth to eighth mesh 22 columns. Similarly, with respect to k=10 to 23, every Sum column is zero in the (k−(m−1))th column to the (k−1)th column. When any Sum column of from the (k−(m−1))th column to the (k−1)th column is not zero, it proceeds to the addition step (S218). When every Sum column of from the (k−(m−1))th column to the (k−1)th column is zero, it proceeds to the determination step (S212).

In the determination step (S212), the determination unit 95 determines whether Sum column of the (k−m)th column is zero or not zero. In the example of FIG. 10, if m=4, with respect to k=9, Sum column is not zero in the fifth mesh 22 column. On the other hand, with respect to k=10 to 23, Sum column is zero in the (k−m)th column. When Sum column of the (k−m)th column is not zero, it proceeds to the threshold value calculation step (S214). When Sum column of the (k−m)th column is zero, it proceeds to the addition step (S218).

In the threshold value calculation step (S214), the threshold value (th) calculation unit 97 calculates a new threshold value (th) by adding a preset threshold value th to the sum total shot number Sum. At this point, since the sum total shot number Sum has not been updated yet, the sum total shot number Sum is still the initial value 0. Therefore, the threshold value (th) after calculation is, at this point, the preset threshold value th.

In the dividing processing step (S216), the dividing processing unit 172 divides the processing region while regarding the end point of the k-th mesh 22 column with respect to which Sum column of the (k−m)th column is not zero in the determination step (S212), as a dividing point (1), wherein the end point is the boundary between the k-th column and the (k+1)th column. Thereby, the first processing region DPB 1 is formed by the mesh 22 columns from the first column to the k-th column with respect to which Sum column of the (k−m)th column is not zero in the determination step (S212). In the example of FIG. 10, if m=4, DPB 1 is formed by the mesh 22 columns from the first column to the ninth column. After the dividing processing, it proceeds to the addition step (S218).

In the addition step (S218), the addition unit 174 adds 1 to the current set k in order to obtain a new k. By this processing, the mesh 22 column advances successively from 1 in the stripe region 20. Then, the dividing unit 70 successively performs dividing the stripe region 20 to be written, advancing in the x direction (predetermined dividing direction). Then, as described above, when a column k of interest (that is, a target column k, or column k concerned) goes into the region 26 (second region) without pattern from the pattern region 24a (first region) with pattern, the dividing unit 70 sets a dividing position (1) in the region 26 without any pattern such that DPB 1 (first data processing region) is formed partly overlapping with the region 26 without pattern.

In the sum total shot number calculation step (S219), the sum total shot number (Sum) calculation unit 98 adds Sum column of the k-th mesh 22 column to the current sum total shot number (Sum).

In the determination step (S220), when Sum column of the k-th column is not zero in the determination step (S208) described above, the determination unit 96 determines whether every Sum column of from the (k−m)th column to the (k−1)th column is zero. In the case of FIG. 10, if m is set to be m=4, for example, with respect to k=24, every Sum column is zero in the mesh 22 columns from the twentieth column to the twenty-third column. With respect to k=25, although every Sum column is zero in the mesh 22 columns from the twenty-first column to the twenty-third column, Sum column is not zero in the twenty-fourth mesh 22 column. When every Sum column is zero in the (k−m)th column to the (k−1)th column, it proceeds to the threshold value calculation step (S214). If one of Sum columns is not zero in the (k−m)th column to the (k−1)th column, it proceeds to the determination step (S222).

In the threshold value calculation step (S214), the threshold value (th) calculation unit 97 calculates a new threshold value (th) by adding a preset threshold value th to the current sum total shot number Sum. At this point, since the sum total shot number Sum has not been updated yet, the sum total shot number Sum is still the initial value 0. Therefore, the threshold value (th) after calculation is, at this point, the preset threshold value th.

In the dividing processing step (S216), the dividing processing unit 172 divides the processing region while regarding the start point of the k-th mesh 22 column with respect to which every Sum column of the (k−m)th column to the (k−1)th column is zero in the determination step (S220), as a dividing point (2), wherein the start point is the boundary between the (k−1)th column and the k-th column. Thereby, the second processing region DPB 2 is formed by the mesh 22 columns from the column of the dividing point (1) to the k-th column with respect to which every Sum column of the (k−m)th column to the (k−1)th column is zero in the determination step (S220). In the example of FIG. 10, if m=4, DPB 2 is formed by mesh 22 columns from the tenth column to the nineteenth column. After the dividing processing, it proceeds to the addition step (S218).

As described above, when the column k of interest goes into the region 24b (first region) with pattern from the region 26 (second region) without pattern, the dividing unit 70 sets a dividing position (2) in the region 26 without pattern such that DPB 2 (second data processing region) which overlaps with the region 26 without pattern, without overlapping with the regions 24a and 24b (first region) each with a pattern is formed. Consequently, this leads to that when the column k of interest goes into the region 24b (first region) with pattern from the region 26 (second region) without pattern, the dividing unit 70 sets a dividing position (2) in the region 26 without pattern such that DPB 3 (first data processing region) which partly overlaps with the region 26 without pattern is formed.

Then, when the column k advances in the stripe region 20, it comes to the k-th mesh 22 column with respect to which no Sum columns of the (k−m)th column to the (k−1)th column are zero in the determination step (S219). In the example of FIG. 10, with respect to k=25, not all Sum columns of the (k−m)th column to the (k−1)th column are zero. Therefore, it proceeds to the determination step (S222).

In the determination step (S222), the determination unit 99 determines whether the current sum total shot number (Sum) having been set exceeds the threshold value th. When not exceeded, it proceeds to the addition step (S218). When exceeded, it proceeds to the threshold value calculation step (S224). In the example of FIG. 10, since the sum total shot number (Sum) does not exceed the threshold value th after the dividing position (2) to the end of the stripe region 20, DPB 3 (first data processing region) is formed by the mesh 22 columns of from the dividing position (2) to the end of the stripe region 20. In addition, although not shown, if there is a dense pattern part in the region 24b with a pattern, or if the width of the region 24b with a pattern is long, the current sum total shot number (Sum) having been set may exceed the threshold value th.

In the threshold value calculation step (S224), the threshold value (th) calculation unit 97 calculates anew threshold value by adding a preset threshold value th having been set in advance to the current set threshold value th.

In the dividing processing step (S216), the dividing processing unit 172 divides the processing region while regarding the end point of the k-th mesh 22 column with respect to which the current sum total shot number (Sum) has exceeded the threshold value th in the determination step (S222), as an unshown dividing point (3), wherein the end point is the boundary between the k-th column and the (k+1)th column. The new threshold value th calculated in the threshold value calculation step (S224) is to be used for a next unshown dividing point (4).

Although the example of FIG. 10 shows the case where the total of the numbers of shots in the region 24a with a pattern does not exceed the threshold value th, it is not limited thereto. There may be a case where the total of the numbers of shots exceeds the threshold value th. In that case, when no Sum columns of the (k−m)th column to the (k−1)th column are zero in the determination step (S219) and the current sum total shot number (Sum) exceeds the threshold value th in the determination step (S222), dividing the processing region should be performed regarding the endpoint of the k-th mesh 22 column, as an unshown dividing point, wherein the end point is the boundary between the k-th column and the (k+1)th column.

Moreover, if dividing the processing region is performed while the number of shots exceeds the threshold value th in the region 24a with a pattern, the current sum total shot number Sum will be, when it proceeds to the threshold value calculation step (S214), the value that was calculated in the sum total shot number calculation step (S219).

As described above, when dividing the stripe region 20 (region to be written) is performed so that DPBs 1 and 3 (first data processing region) each partly overlapping with the region 26 (second region) without pattern may be formed, the dividing unit 70 sets dividing positions (1) and (2) in the region 26 without pattern such that m mesh 22 columns (predetermined margin width), located from each internal end point of the regions 24a and 24b (first region) with patterns toward inside the region 26 without pattern, are included in the DPBs.

As described above, the stripe region 20 (for example, region to be written) is divided into a plurality of meshes 22 each of which is smaller than a data processing region (first and second data processing regions). Then, the dividing unit 70 performs dividing, using the estimated number of shots, into DBPs 1 and 3 (first data processing region) and DBP 2 (second data processing region). In that case, DBPs 1 and 3 (first data processing region) include both the mesh region where the estimated number of shots is not zero and the mesh region where the estimated number of shots is zero. On the other hand, DBP 2 (second data processing region) includes the mesh region where the estimated number of shots is zero, and excludes the mesh region where the estimated number of shots is not zero.

As described above, according to the first embodiment, basically, every time it has become the threshold value th, the processing region is divided such that the number of shots may be around the same as each other. Further, when the region 26 without pattern is formed composed of columns exceeding twice the margin column value m, the processing region is divided by the method described above regardless of the number of shots.

In the dividing step (S112) into shots, the shot division processing unit 76 performs processing of dividing into shots for each processing region which was divided in the dividing step (S110) into DPBs (1). Specifically, the shot division processing unit 76 reads writing data from the storage device 140, and assigns, for each processing region, a figure pattern to be located in the processing region concerned from the writing data. Then, for each processing region, the assigned figure pattern is divided into a plurality of shot figures each being the size irradiatable by one beam shot. For example, a figure pattern is divided, in the x direction from its one end, by a preset maximum shot size. Then, a remained part of the figure pattern, which was not able to be divided by the maximum shot size, and a part of the figure pattern, which is equivalent to the maximum shot size, are added to be divided into halves. Thereby, the figure pattern is divided into a plurality of figures each being the maximum shot size, and two shot figures each being not extremely smaller than the maximum shot size. A similar division is to be performed with respect to the y direction.

The shot division processing unit 76 (an example of a data processing unit) does not perform data processing of the shot division processing (predetermined data processing contents) in the data processing region 50b (second data processing region) which overlaps with the region 26 (second region) without pattern, and performs data processing of the shot division processing (predetermined data processing contents) in the data processing regions 50a and 50c (first data processing region) which respectively overlap with at least the regions 24a and 24b (first region) with a pattern. Thus, it is possible to avoid to perform calculation processing in the data processing region 50b for which the calculation is unnecessary, thereby aiming at an effective use of the resource. Eventually, it leads to shortening of the processing time concerning the entire processing region.

In the dividing step (S120) into DPBs (2), the dividing unit 72 reads writing data from the storage device 140, and divides a region to be written, such as the stripe region 20, into a plurality of data processing regions (DPB) (2). In this case, the processing region (DPB) (2) for area density calculation processing is formed. The dividing processing method of the dividing step (S120) into DPBs (2) may be the same as that of the dividing step (S110) into DPBs (1) except that the threshold value th and the margin column value m are different from those of the dividing step (S110).

Figure 11:
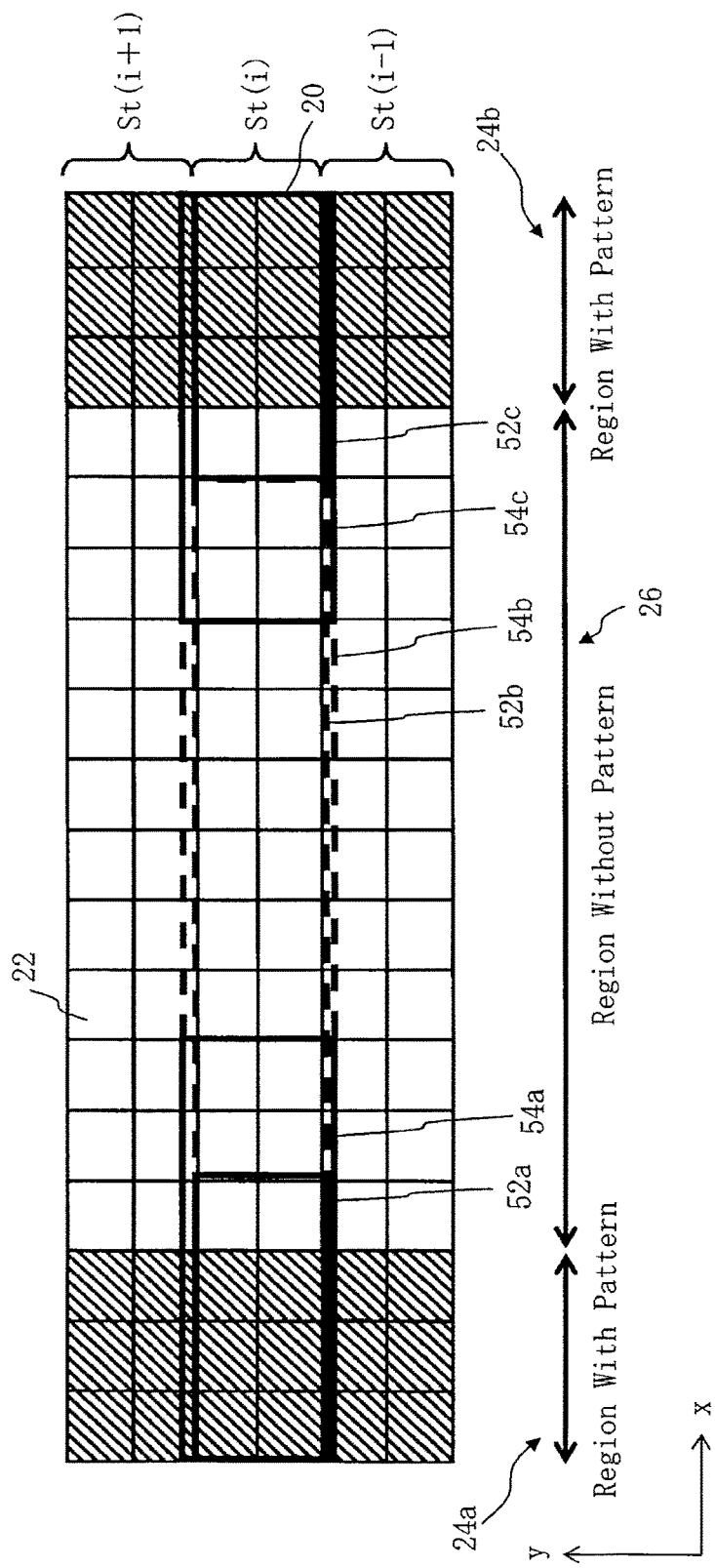
FIG. 11 shows a division example of a processing region for area density calculation processing and a processing region for proximity effect correction calculation processing according to the first embodiment.

FIG. 11 shows a division example of the processing region for area density calculation processing and the processing region for proximity effect correction calculation processing according to the first embodiment. As shown in FIG. 11, according to the first embodiment, the dividing unit 72 divides a region to be written, such as the stripe region 20, into data processing regions 52a and 52c (first data processing regions) that respectively overlap with at least the regions 24a and 24b (first regions) in each of which a pattern has been arranged, and a data processing region 52b (second data processing region) that overlaps with the region 26 (second region) in which no pattern is arranged, without overlapping with the regions 24a and 24b where patterns are arranged. In the case of FIG. 11, at the both ends of the stripe region 20, there are aligned shot number estimation meshes 22 (meshes which are hatched) whose numbers of shots are not zero (that is, a pattern has been arranged therein). On the other hand, in the central part of the stripe region 20, there are aligned, in a large range, shot number estimation meshes 22 (meshes which are not hatched) each of whose number of shots is zero (that is, a pattern has not been arranged). In that case, according to the first embodiment, the data processing region 52a is formed at the position overlapping with at least the region 24a and including, as a margin, the shot number estimation meshes 22 of one or a few columns at the region 26 side close to the region 24a. Moreover, the data processing region 52c is formed at the position overlapping with at least the region 24b and including, as a margin, the shot number estimation meshes 22 of one or a few columns at the region 26 side close to the region 24b. Further, the data processing region 52b which does not overlap with the regions 24a and 24b but overlaps with the region 26 is formed. The case of FIG. 11 shows three stripe regions, the (i−1)th stripe region, the i-th stripe region, and the (i+1)th stripe region, which are adjacent to each other. In each of the three stripe regions 20, the regions 24a and 24b with patterns exist at both the ends of the stripe region 20, and the region 26 without pattern exists in the central part of the stripe region 20.

Although the example of FIG. 11 shows the case where the regions 24 with patterns exist at both the ends of the stripe region 20, it is not limited thereto. For example, there is a possibility that the region 24 with a pattern exists only at one end. Moreover, there is a possibility that the region 24 with a pattern exists only in the central part of the stripe region 20. Alternatively, a plurality of regions 24 with patterns and regions 26 without any pattern may exist in a mixed manner. Thus, the dividing unit 72 divides a region to be written into at least one data processing region 52a which overlaps with at least the region 24 (first region: region with a pattern) where a pattern has been arranged, and at least one data processing region 52b which overlaps with the region 26 (second region: region without any pattern) where no pattern is arranged, without overlapping with the region 24.

In the area density calculation step (S122), the area density calculation unit 78 performs calculation processing for obtaining an area density ρ(x) for each processing region (DPB) (2) divided by the dividing step (S120) into DPBs (2). Specifically, the area density calculation unit 78 reads writing data from the storage device 140, and assigns, for each processing region (DPB) (2), a figure pattern to be located in the processing region concerned from the writing data. On the other hand, the stripe region 20 is divided into a plurality of mesh regions of a predetermined size. For example, it is preferable for the mesh size to be about 1/10 of the influence radius of the proximity effect, and specifically, to be about 0.5 to 2 μm, for example. In each processing region (DPB) (2), for each mesh region located in the processing region, an area density ρ(x) of a figure pattern arranged in the mesh region is calculated. Here, the position x denotes a vector.

The area density calculation unit 78 (an example of the data processing unit) does not perform data processing of the area density calculation processing (predetermined data processing contents) in the data processing region 52b (second data processing region) which overlaps with the region 26 (second region) where no pattern is arranged. On the other hand, the area density calculation unit 78 performs data processing of the area density calculation processing (predetermined data processing contents) in the data processing regions 52a and 52c (first data processing regions) which respectively overlap with at least the regions 24a and 24b (first regions) in which patterns have been arranged. Thus, it is possible to avoid to perform calculation processing in the data processing region 52b for which the calculation is unnecessary, thereby aiming at an effective use of the resource. Eventually, it leads to shortening of the processing time concerning the entire processing region. The area density calculation unit 78 generates, for each processing region 52, an area density ρ(x) map using a calculated area density ρ as a map value of each mesh. The generated area density ρ map is stored in the storage device 144. Moreover, here, a proximity effect density U(x) used for proximity effect correction calculation may also be calculated. The proximity effect density U(x) is calculated, for each processing region 52, as a value obtained by convolving a distribution function $g_p(x)$ and an area density ρ(x). Then, the generated proximity effect density U(x) map is to be stored in the storage device 144.

In the dividing step (S130) into DPBs (3), the dividing unit 74 divides a region to be written such as the stripe region 20 into a plurality of data processing regions (DPB) (3), for example. In this case, a processing region (DPB) (3) for proximity effect correction calculation processing is formed. Since the processing time of proximity effect correction calculation processing is affected by the area, but not affected by pattern densities, or is ignorable as described above, the processing region is divided into a plurality of processing regions 54a, 54b, and 54c being the same size as each other, as shown in FIG. 11, for example. The example of FIG. 11 shows the processing regions 54a, 54b, and 54c only for the i-th stripe region 20.

In the coefficient calculation step (S132) for proximity-effect-corrected irradiation (proximity effect correction calculation processing), the coefficient calculation unit 82 for proximity-effect-corrected irradiation calculates, for each processing region (DPB) (3), a proximity effect correction irradiation coefficient $D_p(x)$ for correcting a dimension variation resulted from the proximity effect. An unknown proximity effect correction irradiation coefficient $D_p(x)$ can be obtained by solving the following equation (1), using a proximity effect coefficient η, a distribution function $g_p(x)$, and an area density ρ(x).

$$\frac{D_p(x)}{2} + \eta \int D_p(x')g_p(x-x')\rho(x')dx' = \frac{1}{2} + \eta \qquad (1)$$

Here, when calculating the proximity effect correction irradiation coefficient $D_p(x)$, the area density ρ(x) map of the processing region (DPB) (2) which at least partly overlaps with a target processing region (DPB) (3) is read.

In the example of FIG. 11, although area density $\rho(x)$ maps for the processing regions 52a and 52b are to be read in the processing region 54a, since the area density $\rho(x)$ map for the processing region 52b does not exist, it is sufficient to read the area density $\rho(x)$ map for the processing region 52a. Similarly, although area density $\rho(x)$ maps for the processing regions 52c and 52b are to be read in the processing region 54c, since the area density $\rho(x)$ map for the processing region 52b does not exist, it is sufficient to read the area density $\rho(x)$ map for the processing region 52c. Furthermore, since the processing region 54b overlaps only with the processing region 52b of the region 26 without pattern, the calculation (proximity effect correction calculation) itself of the proximity effect correction irradiation coefficient $D_p(x)$ can be omitted from the beginning in the processing region 54b.

As described above, if the processing region for area density calculation concerning the processing region 54b in proximity correction calculation is only the processing region 52b that overlaps with the region 26 without pattern, without overlapping with the regions 24a and 24b with patterns, the calculation (proximity effect correction calculation) itself of the proximity effect correction irradiation coefficient $D_p(x)$ can be omitted. Consequently, it is possible to shorten the processing time.

In the dose calculation step (S134) (irradiation time calculation step), the dose calculation unit 84 calculates a dose D(x) by using a base dose $D_B$ and a calculated proximity effect correction irradiation coefficient $D_p(x)$. The dose D(x) can be defined by the following equation (3).

$$D(x)=D_B(x) \cdot D_p(x) \qquad (3)$$

Although the proximity effect correction has been described herein as an example, dose adjustment correction is not limited thereto. In addition to the proximity effect correction, fogging correction, loading effect correction, etc. may also simultaneously be performed, for example. The dose calculation unit 84 generates a dose D(x) map concerning the stripe region 20 or the writing region 10, for example, by using a calculated dose D(x) as a map value of each mesh for area density calculation, for example. The generated dose D(x) map is stored in the storage device 146. Moreover, since the dose D(x) is adjusted by a beam irradiation t(x), it is also preferable to generate an irradiation time t(x) map by calculating an irradiation time t(x) by dividing the dose D(x) by a current density J of an electron beam.

In the shot data generation step (S140), for each processing region (DPB) (1) for shot data generation processing, the shot data generation unit 86 partially cuts out the dose D(x) map (or irradiation time t(x) map), to be corresponding to the processing region (DPB) (1) concerned. Then, the shot data generation unit 86 reads in (loads) the cut-out dose D(x) maps (or irradiation time t(x) maps) in order, reads out (retrieves) data of a dose (or irradiation time) for each shot figure, and additionally defines it in the shot data. The generated shot data is stored in the storage device 148.

In such a case, if the size of the processing region (DPB) (1) is large, the cut-out dose D(x) map (or irradiation time t(x) map) is also large. Therefore, it takes time to read data of a dose (or irradiation time). According to the first embodiment, by dint of forming the processing region 50b that overlaps with the region 26 in which no pattern is arranged, without overlapping with the regions 24a and 24b in which patterns are arranged, the cut-out the dose D(x) map (or irradiation time t(x) map) can be reduced by the size of the processing region 50b. Therefore, processing time for reading out data of a dose (or irradiation time) can be shortened.

In the writing step (S142), under the direction of the writing control unit 88, the control circuit 130 reads shot data and controls the drive of the writing unit 150. Thereby, the writing unit 150 writes a pattern on the target object 101 based on processed data. The writing unit 150 writes a figure pattern defined by the writing data on the target object 100, using the electron beam 200. Specifically, it operates as described below.

The electron beam 200 emitted from the electron gun 201 (emission unit) irradiates the entire first aperture plate 203 having a quadrangular opening by the illumination lens 202. At this point, the electron beam 200 is shaped to be a quadrangle. Then, after passing through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After passing through the second aperture plate 206, the electron beam 200 of a second aperture image is focused by the objective lens 207 and deflected by the main deflector 208 and the sub deflector 209 so as to reach a desired position on the target object 101 placed on the XY stage 105 which moves continuously. FIG. 1 shows the case of using multiple stage deflection of two stages of the main and sub deflectors for position deflection. In such a case, the electron beam 200 of a shot concerned should be deflected to a reference position in a subfield (SF), which is obtained by further virtually dividing the stripe region, by the main deflector 208 while following the movement of the stage, and the beam of a shot concerned should be deflected to each irradiation position in the SF by the sub deflector 209. Moreover, the dose D(x) should be controlled by an irradiation time of the electron beam 200.

As described above, according to the first embodiment, prolongation of the processing time caused by a region where no pattern exists can be inhibited. Therefore, high-speed shot generation processing can be achieved. Moreover, dose correction processing, such as unnecessary proximity effect correction calculation processing, etc. can be omitted.

Second Embodiment

According to the first embodiment, dividing is performed for each stripe region 20 so that the processing region of the stripe region 20 concerned may be divided into a processing region in which a pattern has been arranged, and a processing region in which no pattern is arranged. Now, according to the second embodiment, there will be described a case where the writing region 10 is divided into the stripe region 20 in which a pattern has been arranged, and the stripe region 20 in which no pattern is arranged.

Figure 12:
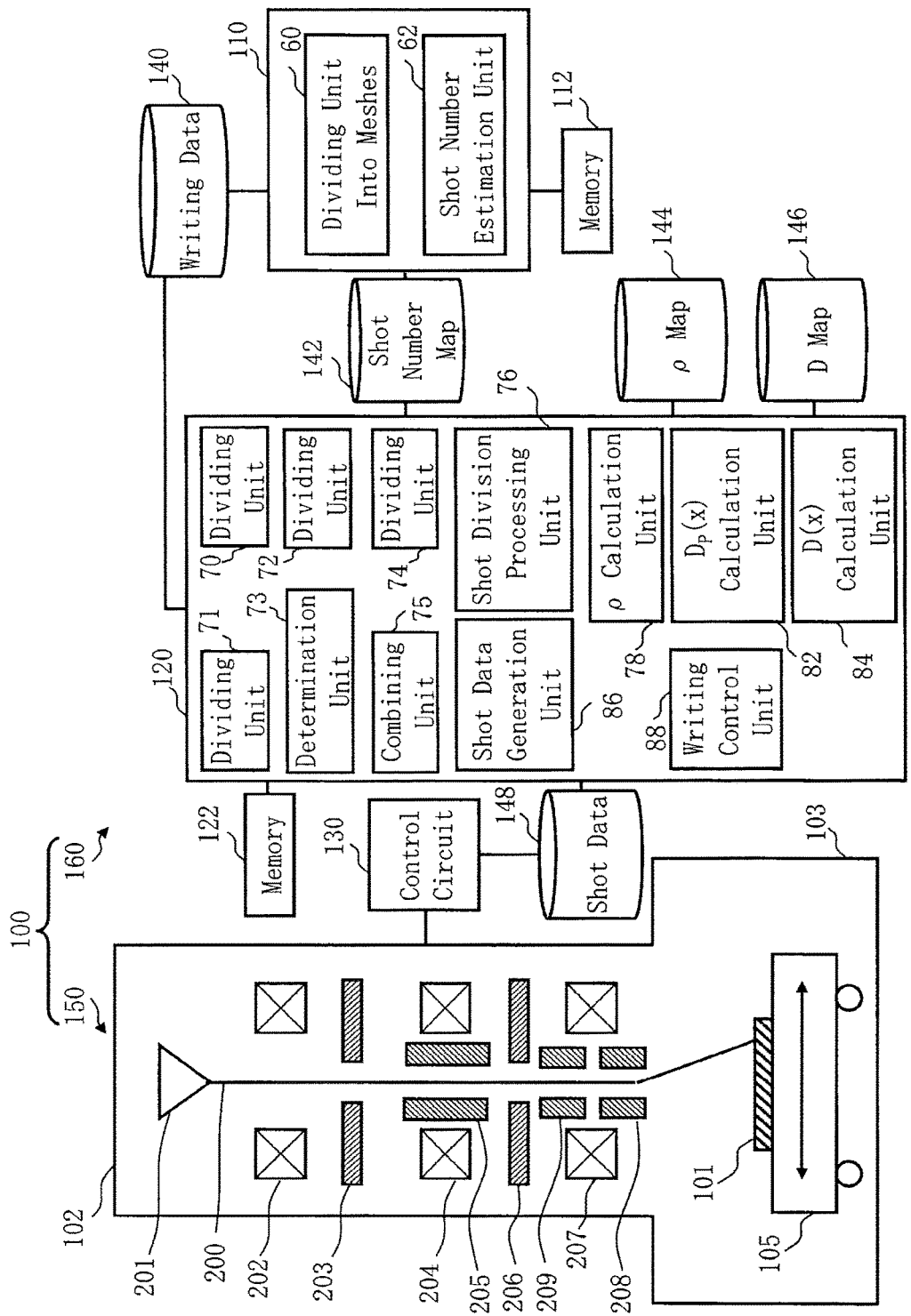
FIG. 12 is a schematic diagram showing a configuration of a writing apparatus according to a second embodiment.

FIG. 12 is a schematic diagram showing the configuration of a writing apparatus according to the second embodiment. FIG. 12 is the same as FIG. 1 except that a determination unit 73 and a combining unit 75 are added in the control computer 120. Functions, such as the dividing units 70, 71, 72, and 74, the determination unit 73, the combining unit 75, the shot division processing unit 76, the area density calculation unit 78, the coefficient calculation unit 82 for proximity-effect-corrected irradiation, the dose calculation unit 84, the shot data generation unit 86, and the writing control unit 88 may be configured by hardware such as an electric circuit, or by software such as a program causing a computer to implement these functions. Alternatively, they may be configured by a combination of hardware and software. Data which is input and output to/from the dividing units 70, 71, 72, and 74, the determination unit 73, the combining unit 75, the shot division processing unit 76, the area density calculation unit 78, the coefficient calculation unit 82 for proximity-effect-corrected irradiation, the dose calculation unit 84, the shot data generation unit 86, and the writing control unit 88, and data being operated are stored in the memory 122 each time.

Figure 13:
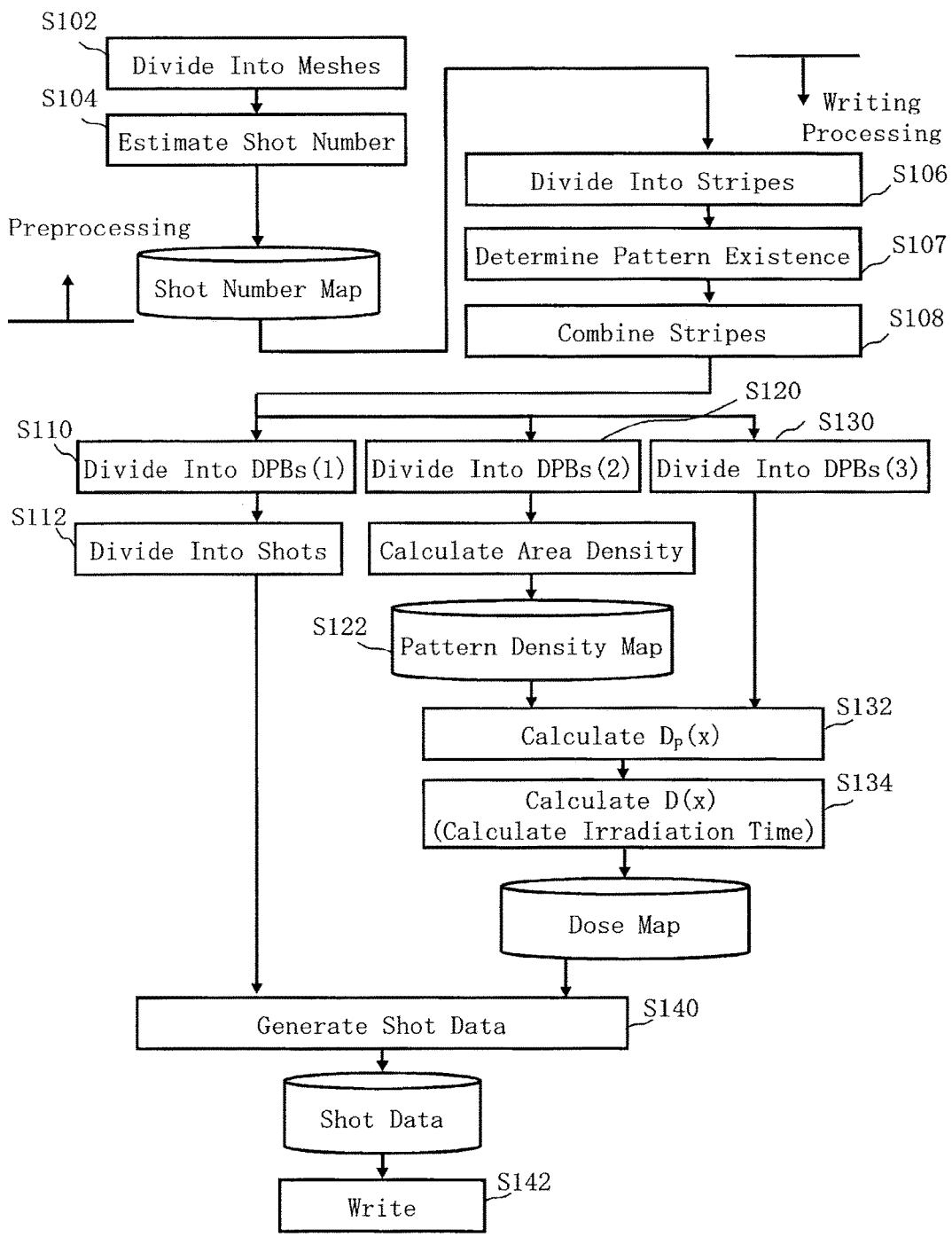
FIG. 13 is a flowchart showing main steps of a writing method according to the second embodiment.

FIG. 13 is a flowchart showing main steps of a writing method according to the second embodiment. The writing method of FIG. 13 according to the second embodiment is the same as that of FIG. 6 except that a dividing step (S106) into stripes, a pattern existence determination step (S107), and a stripe combination step (S108) are added after the shot number estimation step (S104) and before the dividing step (S110) into DPBs (1), the dividing step (S120) into DPBs (2) and the dividing step (S130) into DPBs (3). The contents of the present embodiment are the same as those of the first embodiment except what is described below.

The contents of the dividing step (S102) into meshes and the shot number estimation step (S104) are the same as those of the first embodiment.

In the dividing step (S106) into stripes, the dividing unit 71 reads writing data from the storage device 140, and divides the writing region 10 (an example of a region to be written) into a plurality of strip-shaped stripe regions 20 as shown in FIG. 2.

In the pattern existence determination step (S107), the determination unit 73 (pattern existence determination unit) determines, for each of a plurality of stripe regions 20, whether a pattern is arranged in the stripe region concerned. Specifically, the determination unit 73 reads a shot number map generated for each stripe region from the storage device 142, and distinguishes the stripe region 20 in which the number of shots is zero from the stripe region 20 in which the number of shots is one or more.

Figure 14:
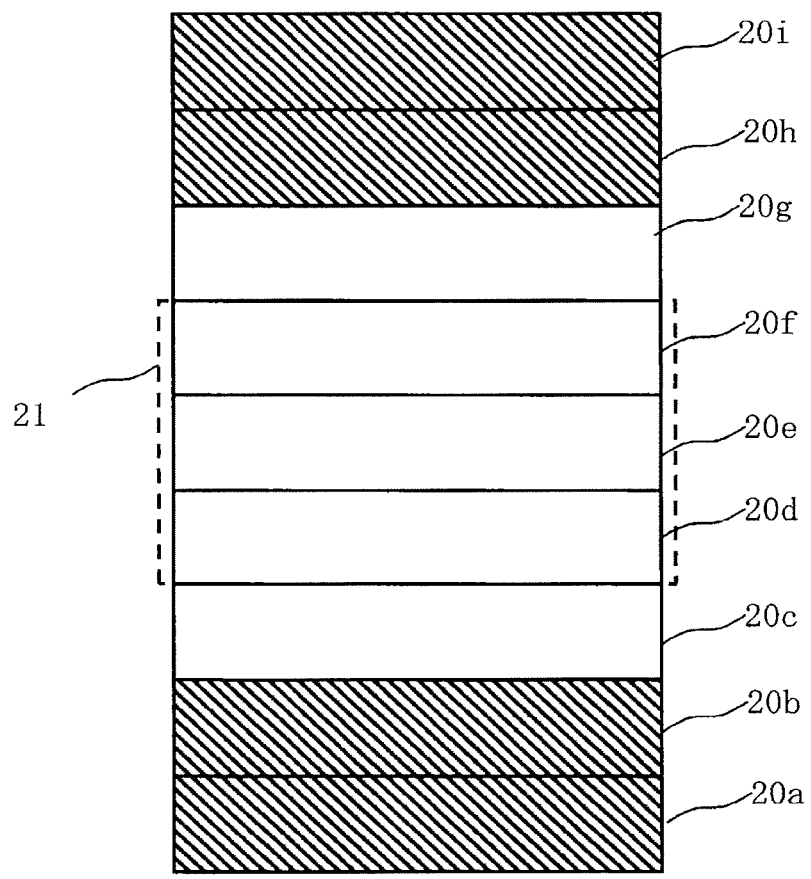
FIG. 14 illustrates a combining method of stripe regions according to the second embodiment.
Figure 15:
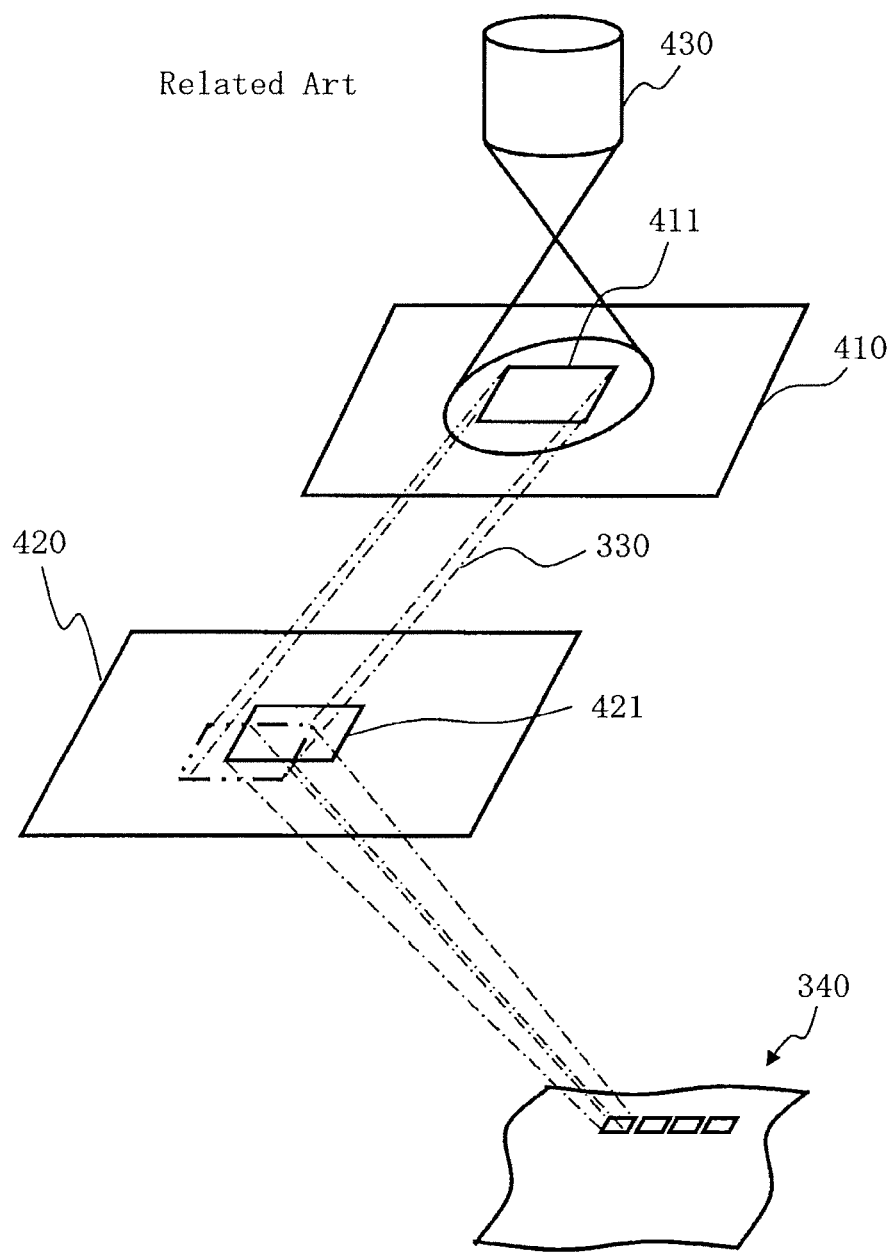
FIG. 15 is a conceptual diagram explaining operations of a variable shaped electron beam writing apparatus.

FIG. 14 illustrates a combining method of stripe regions according to the second embodiment. FIG. 14 shows stripe regions 20a to 20i, as an example. In these stripe regions 20a to 20i, the stripe regions 20a, 20b, 20h, and 20i which are hatched denote stripe regions (stripe regions with patterns) in each of which a pattern has been arranged, and the stripe regions 20c, 20d, 20e, 20f, and 20g denote stripe regions (stripe regions without any pattern) in each of which no pattern is arranged.

In the stripe combination step (S108), the combining unit 75 combines successive stripe regions (stripe regions 20d, 20e, and 20f) which have been determined to be without any pattern in a plurality of stripe regions 20, as a no-pattern stripe region 21. However, as stripe regions in each of which no pattern is arranged, the stripe regions 20c and 20g also exist. It is preferable that the stripe regions 20c and 20g, which are before and after the no-pattern stripe region 21, are not combined in order to be margin regions.

In the dividing step (S110) into DPBs (1), the dividing step (S120) into DPBs (2), and the dividing step (S130) into DPBs (3), data processing is not performed for the no-pattern stripe region 21, but performed for stripe regions 20 other than the no-pattern stripe region 21. In other words, the dividing units 70, 72, and 74, the shot division processing unit 76, the area density calculation unit 78, the coefficient calculation unit 82 for proximity-effect-corrected irradiation, the dose calculation unit 84, and the shot data generation unit 86 (an example of the data processing unit) perform data processing of their respective contents for the stripe regions 20 which are not combined, without performing the data processing for the no-pattern stripe region 21. Thereby, it is possible to omit the determination itself to determine that processing for a certain DPB is unnecessary though the determination has conventionally been performed as a result of DPB processing executed in parallel to writing or of related DPB processing.

In the writing step (S142), under the direction of the writing control unit 88, the control circuit 130 reads shot data and controls the drive of the writing unit 150. Thereby, the writing unit 150 writes a pattern on the target object 101 based on processed data. The writing unit 150 writes a figure pattern defined by the writing data on the target object 100, using the electron beam 200. The other contents are the same as those of the first embodiment.

As described above, according to the second embodiment, prolongation of the processing time caused by a stripe region 20 where no pattern exists can be inhibited. Therefore, high-speed shot generation processing can be achieved more than the first embodiment. Furthermore, dose correction processing, such as unnecessary proximity effect correction calculation processing, etc. can be further omitted compared to the first embodiment.

The embodiments have been explained referring to concrete examples described above. However, the present invention is not limited to these specific examples. For example, although the dividing step (S106) into stripes described in FIG. 13 is omitted in FIG. 6, it should be understood that the dividing step (S106) into stripes is also performed in the first embodiment. Moreover, the shot number map described above may be generated for each stripe region 20 as a unit, or for each writing region 10 (or chip region) as a unit by performing merge processing of the entire writing region 10 (or chip region).

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   a storage device configured to store writing data of a region to be written in a target object;
   processing circuitry configured to perform as
   a dividing section that reads the writing data and divide the region to be written into a plurality of stripe regions each being in a strip shape;
   a pattern existence determination section that determines, for each of the plurality of stripe regions, whether a pattern is arranged in a stripe region concerned in the plurality of stripe regions;

a combining section that combines successive stripe regions which have been determined to be without any pattern, as one no-pattern stripe region in the plurality of stripe regions; and a data processing section that performs data processing of predetermined data processing contents for stripe regions which have been determined by the pattern existence determination section to be with any pattern, without performing the data processing for the no-pattern stripe region; and a writing mechanism including a stage on which the target object is placed, a charged particle beam source, and a deflector and configured to write a pattern on the target object, based on the processed data.

2. A charged particle beam writing method comprising:

reading writing data of a region to be written in a target object, and dividing the region to be written into a plurality of stripe regions each being in a strip shape;

determining, for each of the plurality of stripe regions, whether a pattern is arranged in a stripe region concerned in the plurality of stripe regions;

combining successive stripe regions which have been determined to be without any pattern, as one no-pattern stripe region in the plurality of stripe regions, performing data processing of predetermined data processing contents for stripe regions which have been determined by the determining to be with any pattern, without performing the data processing for the no-pattern stripe region; and writing a pattern on the target object, based on the processed data.

* * * * *